(12) United States Patent
Liang et al.

(10) Patent No.: US 12,327,788 B2
(45) Date of Patent: Jun. 10, 2025

(54) GATE TO SOURCE DRAIN INTERCONNECTS

(71) Applicant: TAIWAN SEMICONDUCTOR MANUFACTURING COMPANY, LTD., Hsinchu (TW)

(72) Inventors: Shuen-Shin Liang, Hsinchu (TW); Chia-Hung Chu, Hsinchu (TW); Po-Chin Chang, Hsinchu (TW); Tzu-Pei Chen, Hsinchu (TW); Ken-Yu Chang, Hsinchu (TW); Hung-Yi Huang, Hsinchu (TW); Harry Chien, Hsinchu (TW); Wei-Yip Loh, Hsinchu (TW); Chun-I Tsai, Hsinchu (TW); Hong-Mao Lee, Hsinchu (TW); Sung-Li Wang, Hsinchu (TW); Pinyen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 590 days.

(21) Appl. No.: 17/577,800

(22) Filed: Jan. 18, 2022

(65) Prior Publication Data
US 2023/0230916 A1    Jul. 20, 2023

(51) Int. Cl.
*H01L 23/522* (2006.01)
*H01L 21/768* (2006.01)
*H01L 23/485* (2006.01)
*H10D 64/01* (2025.01)

(52) U.S. Cl.
CPC .... *H01L 23/5226* (2013.01); *H01L 21/76843* (2013.01); *H01L 21/76877* (2013.01); *H10D 64/01* (2025.01)

(58) Field of Classification Search
CPC ........... H01L 23/5226; H01L 21/76843; H01L 21/76877; H01L 29/401; H01L 21/76805; H01L 21/76816; H01L 21/76831; H01L 21/76834; H01L 21/76844; H01L 21/76895; H01L 21/76897; H01L 23/485
See application file for complete search history.

(56) References Cited

U.S. PATENT DOCUMENTS

| | | | |
|---|---|---|---|
| 2013/0207193 A1* | 8/2013 | Haneda | H01L 21/76814 257/365 |
| 2019/0088542 A1* | 3/2019 | Hsieh | H01L 29/41791 |
| 2021/0134793 A1* | 5/2021 | Kim | H01L 21/76805 |

* cited by examiner

*Primary Examiner* — Herve-Louis Y Assouman
(74) *Attorney, Agent, or Firm* — Birch, Stewart, Kolasch & Birch, LLP

(57) ABSTRACT

A method for manufacturing a semiconductor device includes: forming a lower metal contact in a trench of a first dielectric structure, the lower metal contact having a height less than a depth of the trench and being made of a first metal material; forming an upper metal contact to fill the trench and to be in contact with the lower metal contact, the upper metal contact being formed of a second metal material different from the first metal material and having a bottom surface with a dimension the same as a dimension of a top surface of the lower metal contact; forming a second dielectric structure on the first dielectric structure; and forming a via contact penetrating through the second dielectric structure to be electrically connected to the upper metal contact, the via contact being formed of a metal material the same as the second metal material.

20 Claims, 20 Drawing Sheets

GATE TO SOURCE DRAIN INTERCONNECTS

BACKGROUND

As the gate pitch in a semiconductor device shrinks, the critical dimension (CD) of a contact shrinks as well. When the CD of the contact shrinks to a nanometer (nm) scale (for example, less than 30 nm), the resistivity of the contact increases rapidly due to surface scattering.

A via contact is electrically connected to a conductive contact (e.g., a metal silicide), which is disposed on an active region (e.g., a source/drain region), through a metal contact. The metal silicide is very sensitive to the environment in which manufacturing the semiconductor device is performed, and might be easily damaged during the manufacturing process of the semiconductor device, which may cause increase in the resistance thereof. In addition, when the interface between the via contact and the metal contact is too narrow, the interface resistance between the via contact and the metal contact cannot be reduced effectively. Therefore, a new metal contact structure and a new manufacturing method therefor are desirable to reduce the resistance between the via contact and the metal contact, and to protect the metal silicide from damage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
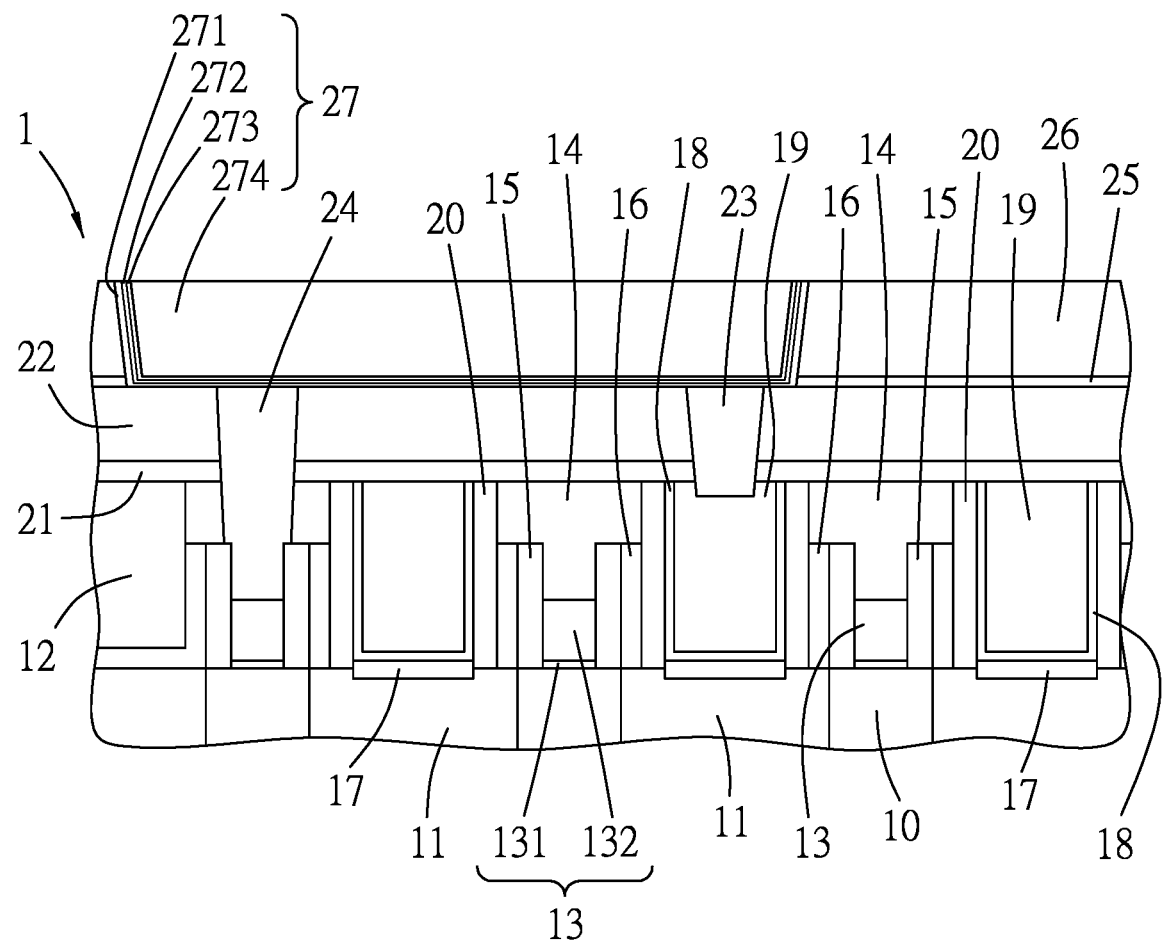
FIG. 1 is a schematic view illustrating a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "below," "proximate," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic view of an example of a semiconductor device 1 at an intermediate stage of a manufacturing method thereof in accordance with some embodiments. The semiconductor device 1 includes a semiconductor substrate 10; source/drain (S/D) regions 11 (i.e., active regions) disposed in the semiconductor substrate 10; a first interlayer dielectric (ILD) layer 12 disposed on the semiconductor substrate 10 and the S/D regions 11; gate structures 13 which are inserted in the first ILD layer 12 and disposed on the semiconductor substrate 10, and each of which is disposed between corresponding two of the S/D regions 11 and includes a gate dielectric 131 disposed on the semiconductor substrate 10 and a metal gate 132 disposed on the gate dielectric 131; self-aligned contacts (SACs) 14 disposed on the gate structures 13, respectively; inner gate spacers 15 disposed in the first ILD layer 12 to laterally cover the gate structures 13 and lower portions of the SACs 14; outer gate spacers 16 disposed in the first ILD layer 12 to laterally cover the inner gate spacers 15; conductive contacts 17 disposed on the S/D regions 11, respectively; protective liners 18 disposed on the conductive contacts 17, respectively; metal contacts 19 disposed on the protective liners 18, respectively, and separated from the conductive contacts 17 by the protective liners 18, respectively; and contact spacers 20 disposed in the first ILD layer 12 to laterally cover the conductive contacts 17 and the protective liners 18. The semiconductor device 1 further includes a middle contact etch stop layer (MCESL) 21 disposed on the first ILD layer 12 to cover the metal contacts 19, the protective liners 18, the contact spacers 20, and the SACs 14; a second ILD layer 22 disposed on the MCESL 21; a first via contact 23 penetrating through the second ILD layer 22 and the MCESL 21 to be electrically connected to a corresponding one of the metal contacts 19; a second via contact 24 penetrating through the second ILD layer 22, the MCESL 21, and a corresponding one of the SACs 14 to be electrically connected to a corresponding one of the gate structures 13; an etch stop layer 25 disposed on the second ILD layer 22; a dielectric layer 26 disposed on the etch stop layer 25; and a metal line 27 disposed in the dielectric layer 26, and electrically connected to a corresponding one of the metal contacts 19 through the first via contact 23 or electrically connected to a corresponding one of the gate structures 13 through the second via contact 24.

In some embodiments, the semiconductor substrate 10 may include, for example, but not limited to, an elemental semiconductor or a compound semiconductor. The elemental semiconductor includes a single species of atoms, such as silicon (Si) or germanium (Ge) in column XIV of the periodic table, and may be in crystal, polycrystalline, or an amorphous structure. Other suitable materials are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location in the compound semiconductor. The compound semiconductor may be formed over a silicon substrate. The compound semiconductor may be strained. In some embodiments, the semiconductor substrate 10 may include a multilayer compound semiconductor structure. In some embodiments, the semiconductor substrate 10 may be a semiconductor-on-insulator (SOI) (e.g., silicon germanium-on-insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorous (P), or arsenic (As). Other suitable materials are within the contemplated scope of the present disclosure.

In some embodiments, the S/D regions 11 may be formed by epitaxially growing a layer of a semiconductor material using a selective epitaxial growth (SEG) process. The S/D regions 11 may be, for example, but not limited to, crystalline silicon (or other suitable semiconductor materials) in-situ doped with a P-type impurity during the SEG process, so as to form P-type S/D regions for PMOS (P-type metal oxide semiconductor) transistors. The P-type impurity may be, for example, but not limited to, boron, aluminum, gallium, indium, $BF_2$, other suitable materials, or combinations thereof. The S/D regions 11 may include one or multiple layers of the semiconductor material. In some embodiments, the S/D regions 11 may be fabricated by forming a SiGe alloy layer using the SEG process and then forming a Si cap layer on top of the SiGe alloy layer, followed by implanting a P-type light doping grain (for example, but not limited to, boron, aluminum, gallium, indium, $BF_2$, other suitable materials, or combinations thereof) so as to form the P-type S/D regions. In some embodiments, the S/D regions 11 may be, for example, but not limited to, crystalline silicon (or other suitable semiconductor materials) in-situ doped with an N-type impurity during the SEG process, so as to form N-type S/D regions for NMOS (N-type metal oxide semiconductor) transistors. The N-type impurity may be, for example, but not limited to, phosphorous, nitrogen, arsenic, antimony, other suitable materials, or combinations thereof. In some embodiments, the S/D regions 11 may be fabricated by forming a SiGe alloy layer using the SEG process and then forming a Si cap layer on top of the SiGe alloy layer, followed by implanting an N-type light doping grain (for example, but not limited to, phosphorous, nitrogen, arsenic, antimony, other suitable materials, or combinations thereof) so as to form the N-type S/D regions.

In some embodiments, the first ILD layer 12 may include a dielectric material, such as silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (purchased from Applied Materials Inc., Santa Clara, Calif.), Xerogel, Aerogel, polyimide, Parylene, BCB (bis-benzocyclobutenes), Flare, SiLK™ (purchased from Dow Chemical Co., Midland, Mich.), non-porous materials, porous materials, or combinations thereof. In some embodiments, the first ILD layer 12 may include a high density plasma (HDP) dielectric material (e.g., HDP oxide), a high aspect ratio process (HARP) dielectric material (e.g., HARP oxide), or a combination thereof. In some embodiments, the first ILD layer 12 may be a planarized dielectric film. The first ILD layer 12 may be formed by a suitable deposition process known to those skilled in the art of semiconductor fabrication, for example, but not limited to, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), or low-pressure chemical vapor deposition (LPCVD).

In some embodiments, the gate dielectric 131 may be a high-k dielectric layer. In some embodiments, the gate dielectric 131 may include hafnium oxide (HfO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, metal oxynitrides, metal aluminates, transition metal nitrides, transition metal silicates, transition metal oxides, silicon oxide, silicon nitride, silicon oxynitride, zirconium silicate, zirconium aluminate, other suitable high-k dielectric materials, or combinations thereof. Examples of metal oxides for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. An interfacial layer may be disposed below the gate dielectric 131 to reduce damage between the gate dielectric 131 and the semiconductor substrate 10. The interfacial layer may comprise silicon oxide.

In some embodiments, the metal gate 132 may include several layers, for example, but not limited to, a blocking/wetting layer, a work function layer, and a conductive layer. The blocking/wetting layer prevents or reduces metal impurities from penetrating into any dielectric layers (for example, the gate dielectric 131) disposed below the blocking/wetting layer, and also provides desirable interface quality between the blocking/wetting layer and any material layer formed over the blocking/wetting layer. In some embodiments, the blocking/wetting layer includes, for example, but not limited to, titanium aluminum nitride (TiAlN), other suitable metal nitrides, titanium aluminum carbonitride (TiAlCN), other suitable metal carbonitrides, or combinations thereof. The work function layer includes a material which is used to tune some work function values of the metal gate 132. In some embodiments, the work function layer may include titanium aluminum carbonitride which has a composition different from that of the titanium aluminum carbonitride of the blocking/wetting layer. In some embodiments, the conductive layer includes aluminum, copper, tungsten, a metal alloy, a metal silicide, other conductive materials, or combinations thereof.

In some embodiments, the SACs 14 includes silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials.

In some embodiments, the inner gate spacers 15 may be formed from a spacer layer which may include, for example, but not limited to, silicon oxide, silicon nitride, silicon carbide, silicon oxycarbide, silicon oxynitride, silicon carbonitride, silicon oxycarbonitride, or combinations thereof. The outer gate spacers 16 may be formed from a spacer layer which may be similar to that for forming the inner gate spacers 15.

In some embodiments, the conductive contacts 17 may include, for example, but are not limited to, a metal silicide material. Examples of the metal silicide material may include titanium silicide ($Ti_xSi_y$), molybdenum silicide ($Mo_xSi_y$), nickel silicide ($Ni_xSi_y$), ruthenium silicide ($Ru_xSi_y$), cobalt silicide ($Co_xSi_y$), tungsten silicide ($W_xSi_y$), europium silicide ($Eu_xSi_y$), erbium silicide ($Er_xSi_y$), titanium germanosilicide ($Ti_xSi_yGe_z$), molybdenum germanosilicide ($Mo_xSi_yGe_z$), nickel germanosilicide ($Ni_xSi_yGe_z$), ruthenium germanosilicide ($Ru_xSi_yGe_z$), cobalt germanosilicide ($Co_xSi_yGe_z$), tungsten germanosilicide ($W_xSi_yGe_z$), europium germanosilicide ($Eu_xSi_yGe_z$), erbium germanosilicide ($Er_xSi_yGe_z$), and the like, and combinations thereof, but are not limited thereto. The metal silicide material may be subjected to a nitridation treatment to reduce oxidation thereof during the manufacturing method of the semiconductor device 1. For example, titanium silicide may be subjected to a nitridation treatment so as to form titanium silicon nitride (TiSiN), and nickel silicide may be subjected to a nitridation treatment so as to form nickel silicon nitride (NiSiN).

The protective liners 18 are used to protect the conductive contacts 17 from oxidation during the manufacturing method of the semiconductor device 1 (for example, in a front opening unified pod (FOUP)). In some embodiments, the protective liners 18 may include a metal material, examples of which include ruthenium (Ru), cobalt (Co), molybdenum (Mo), tungsten (W), nickel (Ni), (Tr), rhodium (Rh), osmium (Os), and the like, and combinations thereof, but are not limited thereto, as well as nitrides of the metal material.

In some embodiments, the metal contacts 19 may include a metal material, examples of which include Ru, Co, Mo, W, Ni, Ir, Rh, Os, and the like, or combinations thereof, but are not limited thereto. The metal material for the metal contacts 19 may be the same as that for the protective liners 18.

In some embodiments, the contact spacers 20 may include, for example, but not limited to, silicon oxide, silicon nitride, silicon carbide, silicon oxycarbide, silicon oxynitride, silicon carbonitride, silicon oxycarbonitride, boron nitride, silicon boron nitride, or combinations thereof. The contact spacers 20 may have a thickness ranging from about 10 Å to about 50 Å. When the thickness of the contact spacers 20 is less than 10 Å, the protective liners 18 cannot be fully covered by the contact spacers 20. When the thickness of the contact spacers 20 is greater than 50 Å, the resistance attributed by the contact spacers 20 may be increased undesirably.

The MCESL 21 may be formed on the first ILD layer 12 by a suitable deposition process known to those skilled in the art of semiconductor fabrication, for example, but not limited to, CVD, PVD, ALD, HDPCVD, MOCVD, RPCVD, PECVD, or LPCVD. In some embodiments, the MCESL 21 includes silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials.

The second ILD layer 22 is formed on the MCESL 21 by a suitable deposition process which may be the same or similar to that for forming the first ILD layer 12. The second ILD layer 22 may include a dielectric material which may be the same or similar to that for forming the first ILD layer 12.

The first via contact 23 is formed in the second ILD layer 22 and penetrates through the MCESL 21 by, for example, but not limited to, a single damascene process, so as to be electrically connected to the corresponding one of the metal contacts 19. In some embodiments, formation of the first via contact 23 includes the following steps. First, a via opening is formed through the second ILD layer 22 and MCESL 21 to expose the corresponding one of the metal contacts 19 from the via opening. After formation of the via opening, the first via contact 23 is formed by depositing a metal material to fill the via opening and then removing excess of the metal material above the second ILD 22 by a planarization technique, such as chemical mechanical planarization (CMP). In some embodiments, the metal material may include, for example, but not limited to, Ru, Co, Mo, W, Ni, Ir, Rh, Os, and the like, or combinations thereof. In some embodiments, deposition of the metal material may be conducted by a suitable technique known to those skilled in the art of semiconductor fabrication, for example, but not limited to, CVD, PECVD, ALD, PEALD, selective CVD, selective ALD, super conformal ALD, super conformal CVD, or other suitable deposition techniques. In some embodiments, a metal halide precursor (e.g., fluoride, chloride, bromide, or iodide of the metal material) or a metal organic precursor (including an organic ligand (e.g., $-OC_{1-6}$, $-CO$, -acac, or the like) and the metal material) may be used for selective CVD or selective ALD.

The second via contact 24 is formed in the second ILD layer 22 and penetrates through the MCESL 21 and the corresponding one of the SACs 14 by, for example, but not limited to, a dual damascene process, so as to be electrically connected to the corresponding one of the gate structures 13. In some embodiments, formation and material of the second via contact 24 may be the same as or similar to those of the first via contact 23.

The etch stop layer 25 may be formed on the second ILD layer 22 by a suitable deposition process which may be the same as or similar to that for forming the MCESL 21. The etch stop layer 25 may include a material which may be the same or similar to that for forming the MCESL 21.

The dielectric layer 26 may be formed on the etch stop layer 25 by a suitable deposition process which may be the same as or similar to that for forming the first ILD layer 12. The dielectric layer 26 may include a dielectric material which may be the same or similar to that for forming the first ILD layer 12.

The metal line 27 may be formed in the dielectric layer 26 by a process which may be the same or similar to that for forming the first via contact 23. In some embodiments, the metal line 27 may include a barrier layer 271, a first liner layer 272 covering the barrier layer 271, a second liner layer 273 covering the first liner layer 272, and a conductive layer 274 filled in a space defined by the second liner layer 273. In some embodiments, the barrier layer 271 may include titanium, tantalum, other suitable metals, titanium nitride, tantalum nitride, other suitable metal nitrides, and the like. The first liner layer 272 may include cobalt and other suitable metals. The second liner layer 273 may include ruthenium and other suitable metals. The conductive layer 274 may include silver, aluminum, copper, tungsten, nickel, other suitable metal materials, alloys thereof, or combinations thereof.

The interface between the first via contact 23 and the corresponding one of the metal contacts 19 has a relatively small contact area, which contributes to a relatively large interface resistance between the first via contact 23 and the corresponding one of the metal contacts 19, resulting in the semiconductor device 1 may have a relatively high resistance.

Figure 2:
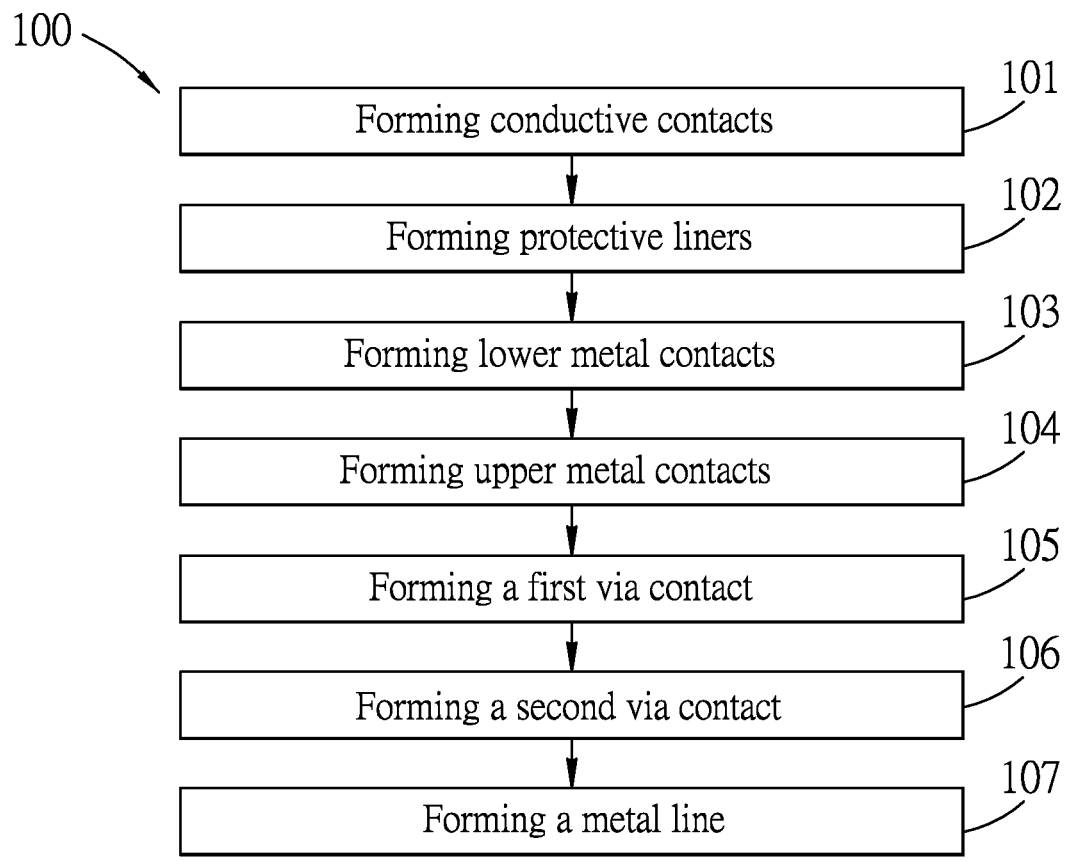
FIG. 2 is a flow diagram illustrating a method for manufacturing a semiconductor device in accordance with some embodiments.

FIG. 2 is a flow diagram illustrating a method 100 for manufacturing a semiconductor device in accordance with some embodiments. FIGS. 3 to 13 illustrate schematic views of a semiconductor device 2 during various stages of the method 100 shown in FIG. 2. The method 100 and the semiconductor device 2 are collectively described below. However, additional steps can be provided before, after or during the various stages of the method 100, and some of the steps described herein may be replaced by other steps or be eliminated. Similarly, further additional features may be present in the semiconductor device 2, and/or the features present may be replaced or eliminated in additional embodiments.

Referring to FIG. 2, the method 100 begins at block 101, where conductive contacts are formed. Referring to the example illustrated in FIG. 3, the semiconductor device 2 includes the semiconductor substrate 10; the source/drain (S/D) regions 11 (i.e., the active regions) disposed in the semiconductor substrate 10; the first ILD layer 12 disposed on the semiconductor substrate 10 and the S/D regions 11; the gate structures 13 which are inserted in the first ILD layer 12 and disposed on the semiconductor substrate 10, and each of which is disposed between corresponding two of the S/D regions 11; the SACs 14 disposed on the gate structures 13, respectively; the inner gate spacers 15 disposed in the first ILD layer 12 to laterally cover the gate structures 13 and lower portions of the SACs 14; the outer gate spacers 16 disposed in the first ILD layer 12 to laterally cover the inner gate spacers 15; and the contact spacers 20 disposed in the first ILD layer 12 to laterally cover the outer spacers 16 and the SACs 14. The semiconductor substrate 10, the source/drain (S/D) regions 11, the first ILD layer 12, the gate structures 13, the SACs 14, the inner gate spacers 15, the outer gate spacers 16, and the contact spacers 20 are the same as or similar to those described above for the semiconductor device 1 with reference to FIG. 1, and thus details thereof are omitted for the sake of brevity.

Figure 3:
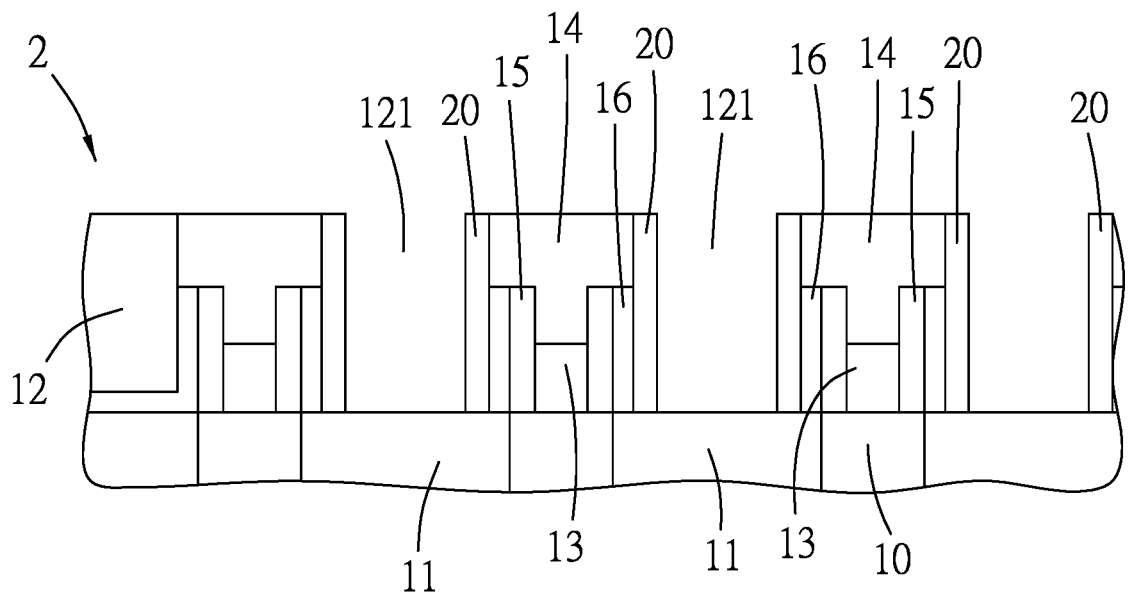
FIGS. 3 to 13 are schematic views illustrating intermediate stages of a method for manufacturing the semiconductor device in accordance with some embodiments.
Figure 4:
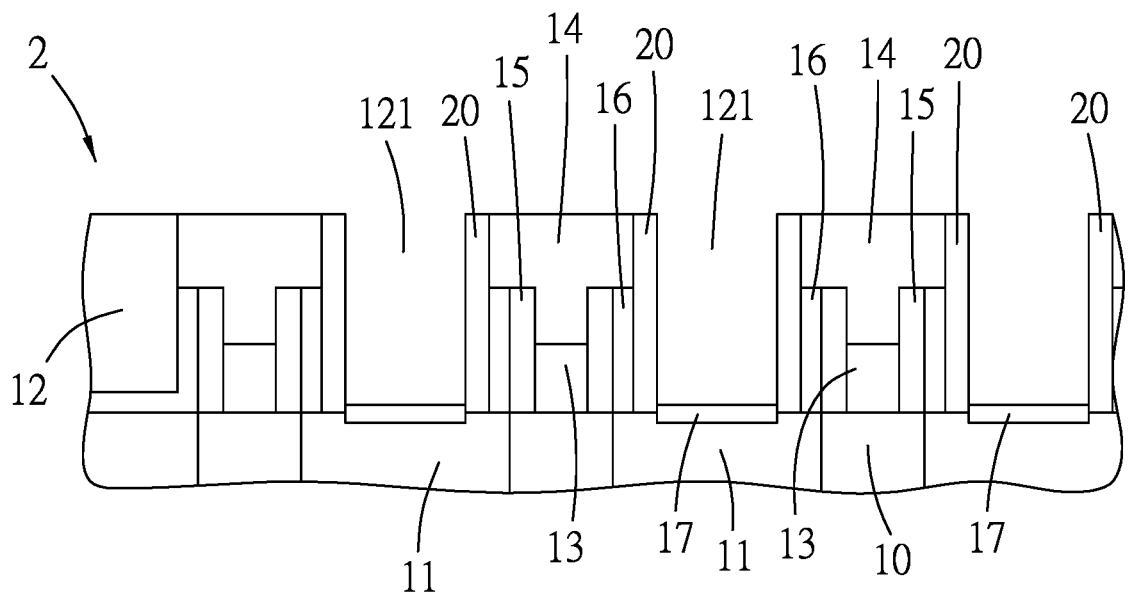
Figure 5:
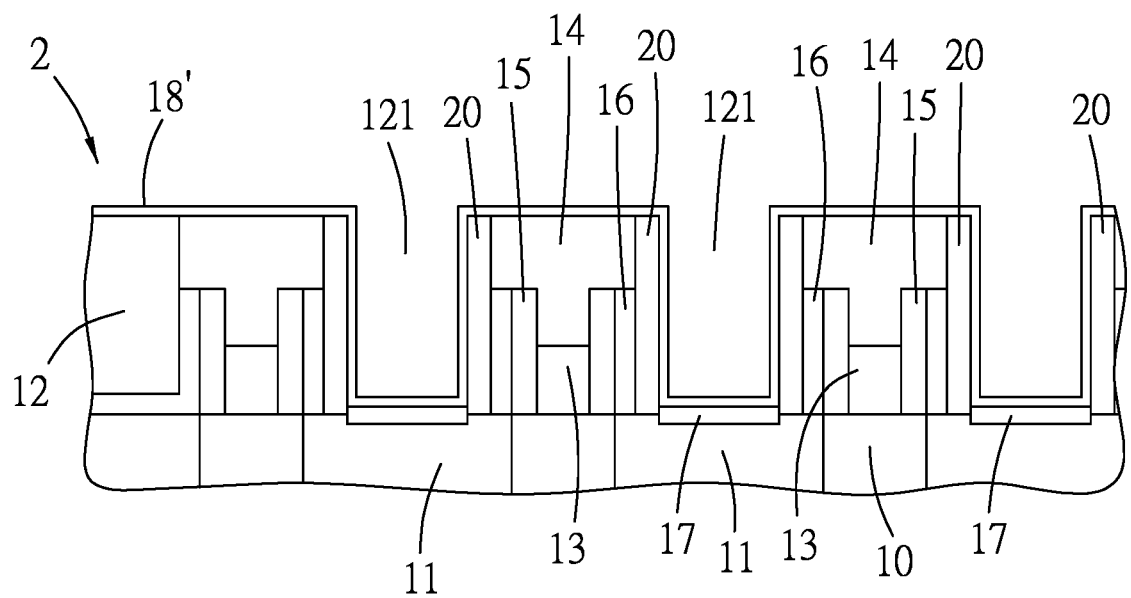

Referring to the examples illustrated in FIGS. 3 and 4, the conductive contacts 17 may be formed on the S/D regions 11, respectively, by a suitable formation process known to those skilled in the art of semiconductor fabrication. For example, in some embodiments in which the conductive contacts 17 are made of metal silicide, the conductive contacts 17 may be formed by a pre-silicidation implantation process in which implant regions are formed, followed by a silicidation process in which the implant regions are subjected to a silicidation process so as to form the conductive contacts 17. In the pre-silicidation implantation process, dopants (for example, but not limited to, metal dopants) are implanted through trenches 121 defined by the contact spacers 20. In some embodiments, the silicidation process may include an annealing operation, the conductive contacts 17 made of metal silicide are formed only in the implant regions including the metal dopants, and the conductive contacts 17 made of metal silicide are formed after the annealing operation. The conductive contacts 17 may have a thickness of at least about 3 nm. When the thickness of the conductive contacts 17 is less than 3 nm, the conductive contacts 17 may not be formed as a complete layered structure on the S/D regions 11. In some embodiments, the thickness of the conductive contacts 17 ranges from about 3 nm to about 10 nm. Details of the material for the conductive contacts 17 are as described above for the semiconductor device 1 with reference to FIG. 1, and thus are omitted for the sake of brevity.

Referring to FIG. 2, the method 100 then proceeds to block 102, where protective liners are formed. Referring to the example illustrated in FIG. 5, a protective layer 18' is conformally deposited to cover first ILD layer 12, the SACs 14, the contact spacers 20, and the conductive contacts 17. In some embodiments, the protective layer 18' may be formed by a suitable in-situ deposition process known to those skilled in the art of semiconductor fabrication, for example, but not limited to, CVD, PECVD, ALD, PEALD, or other suitable deposition techniques. In some embodiments, the protective layer 18' may include a metal material, examples of which include Ru, Co, Mo, W, Ni, Ir, Rh, Os, and the like, or combinations thereof, and but are not limited thereto. In order to prevent the conductive contacts 17 from being damaged during the in-situ deposition process, the in-situ deposition process is performed in an oxygen-free environment (for example, an environment in which $H_2O$, $CO_2$, CO, O, OH, and the like are not included), which includes the precursors for forming the protective layer 18' with the exception of halide such as chloride and fluoride, and which includes the carrier gas for carrying the precursors with the exception of carbon dioxide, carbon monoxide, oxygen, and the like. The chamber for deposition of the metal material of the protective layer 18' is positioned proximate to that for forming the conductive contacts 17.

Figure 6:
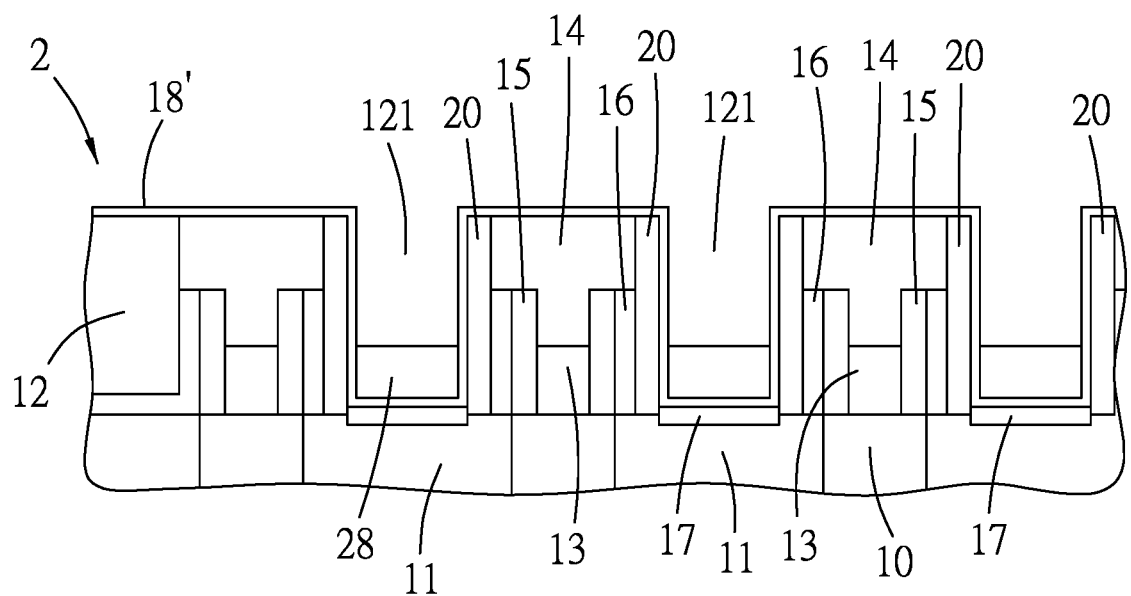

Referring to the example illustrated in FIG. 6, a bottom anti-reflective coating (BARC) layer 28 (i.e., a photoresist layer, for example, but not limited to, a silicon oxynitride (SiON) layer) is deposited by a suitable coating process known to those skilled in the art of semiconductor fabrication (for example, but not limited to, a spin-coating process) so as to fill the trenches 121, and is then etched back to a height less than a depth of the trenches 121 by a suitable etching process known to those skilled in the art of semiconductor fabrication (for example, but not limited to, a dry etching process).

Figure 7:
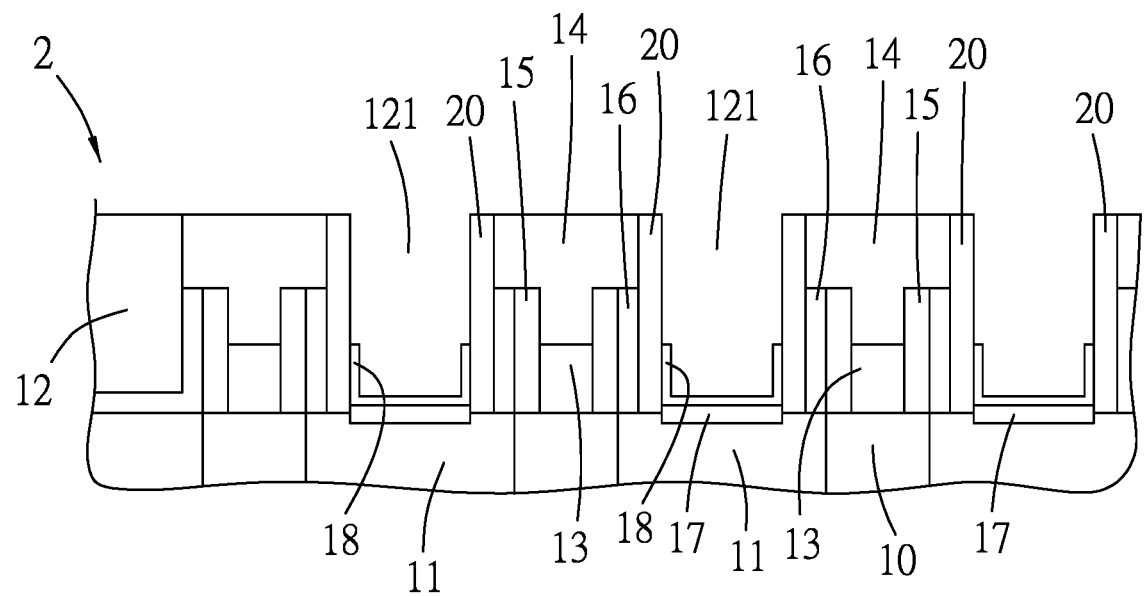
Figure 8:
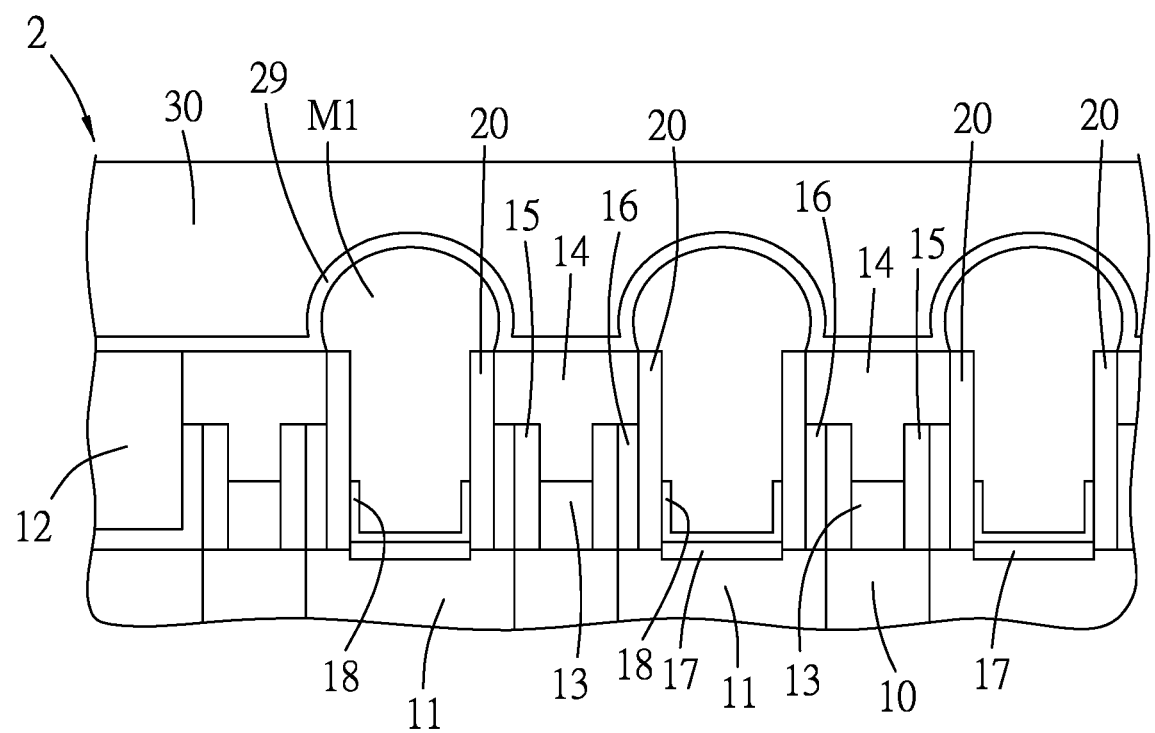
Figure 9:
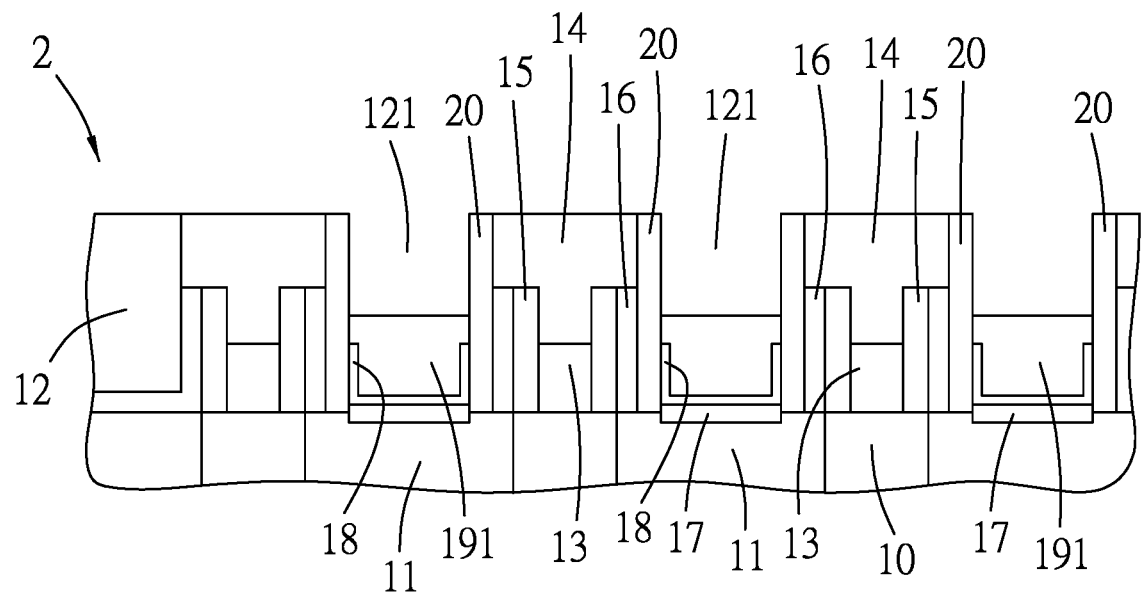
Figure 10:
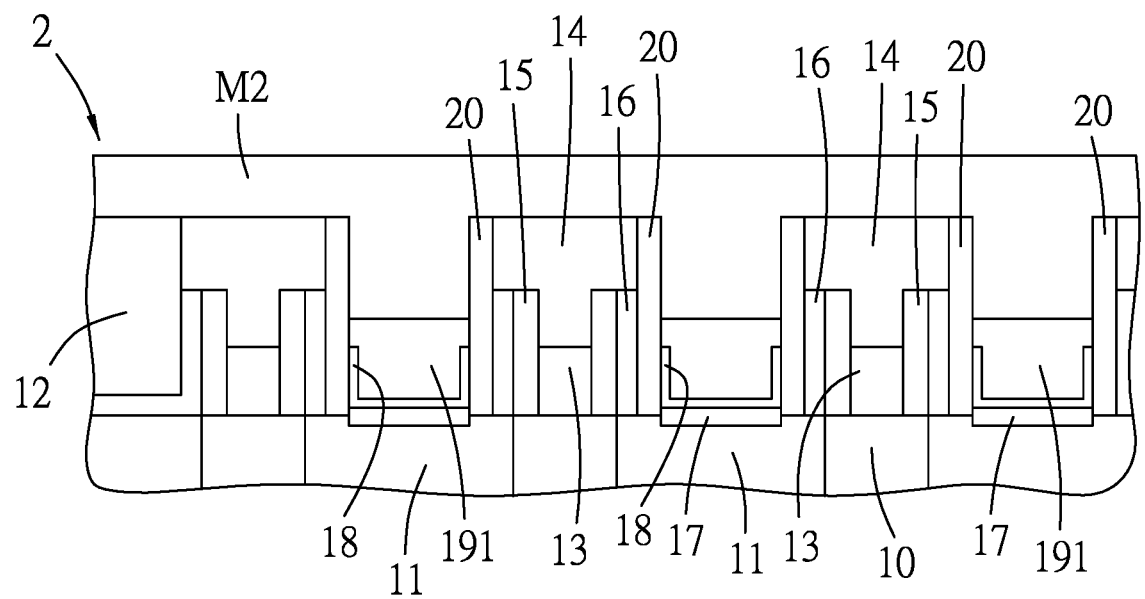
Figure 11:
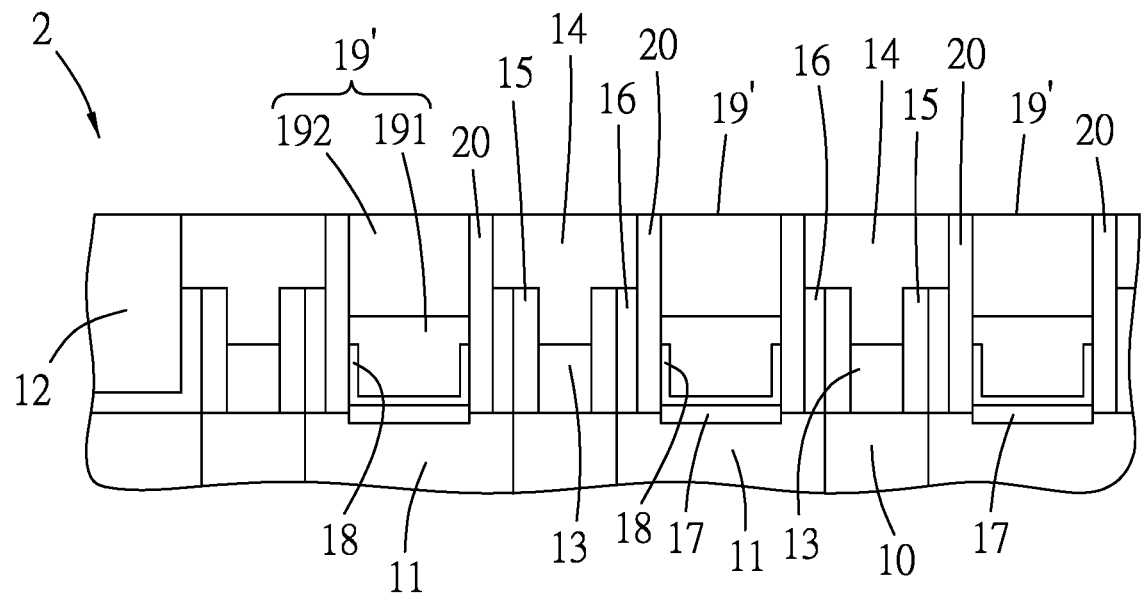
Figure 12:
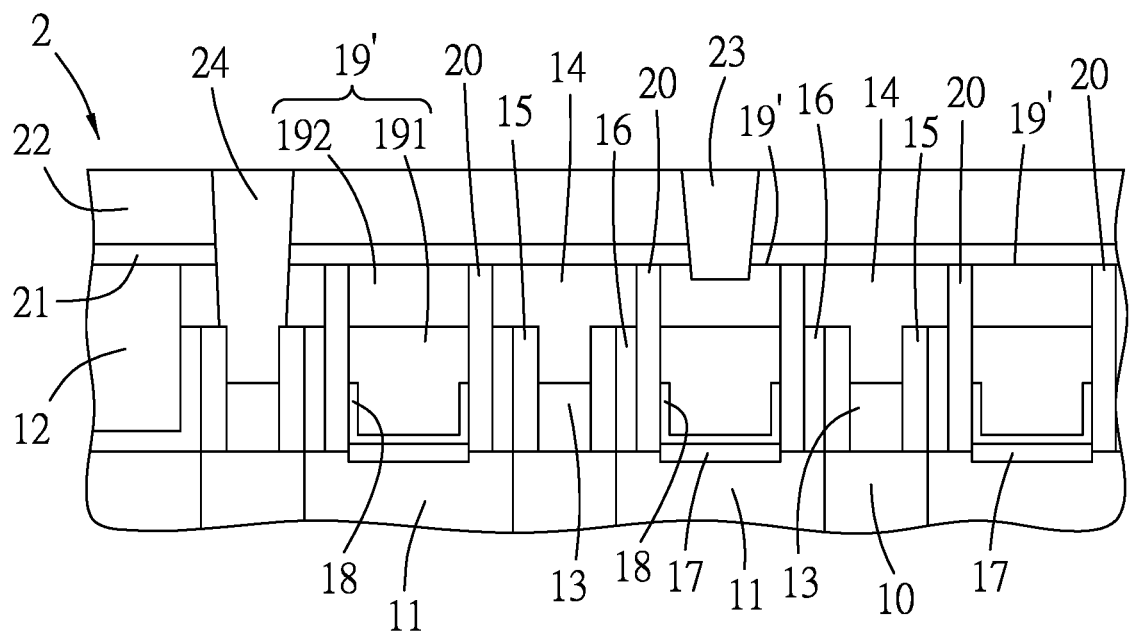
Figure 13:
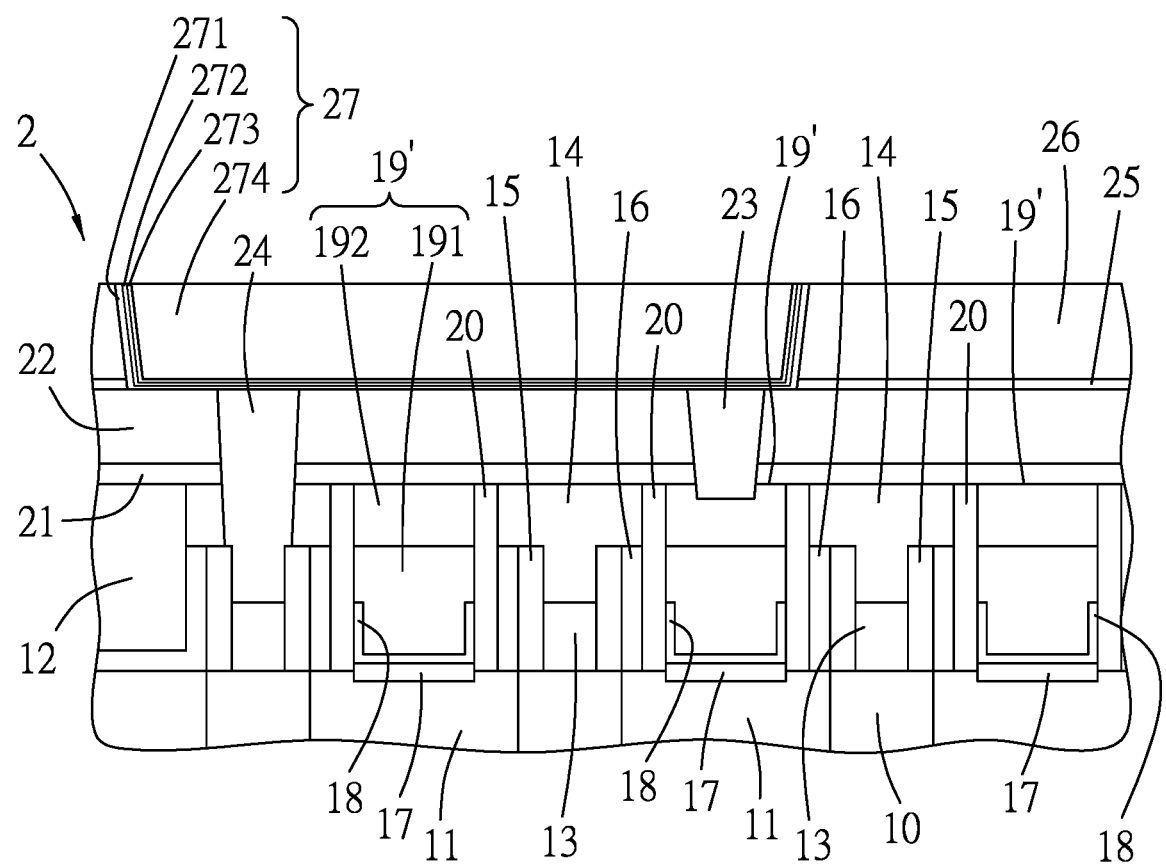

Referring to the examples illustrated in FIGS. 6 and 7, a portion of the protective layer 18' above the BARC layer 28 is removed by a suitable etching process (for example, but not limited to, a wet etching process) based on a relatively high etching selectivity of the protective layer 18' with respect to the BARC layer 28. The BARC layer 28 is then removed completely by, for example, but not limited to, a dry etching process to form the protective liners 18. Each of the protective liners 18 includes a bottom portion and a sidewall portion extending upwardly from a periphery of the bottom portion. In some embodiments, the protective liners 18 may have a thickness ranging from about 0.3 nm to about 5.0 nm. When the thickness of the protective liners 18 is less than 0.3 nm, the conductive contacts 17 may not be protected effectively by the protective liners 18 during the subsequent stages of the manufacturing method of the semiconductor device 2. When the thickness of the protective liners 18 is greater than 5.0 nm, the resistance attributed by the protective liners 18 may be increased undesirably.

Referring to FIG. 2, the method 100 then proceeds to block 103, where lower metal contacts are formed. Referring to the examples illustrated in FIGS. 7 and 8, a first metal material M1 is filled into the trenches 121 by a selective deposition process (for example, but not limited to, selective CVD or selective ALD), a super conformal deposition process (for example, but not limited to, super conformal ALD or super conformal CVD), or the like. The super conformal deposition process is a conformal deposition process in which a deposition rate of the first metal material M1 on the bottom portions of the protective liners 18 is greater than that on the sidewall portions of the protective liners 18. Since the selective deposition process or the super conformal deposition process is used and the protective liners 18 have a height less than the depth of the trenches 121, no seam is formed in the first metal material M1 filled into the trenches 121. Examples of the first metal material M1 include Ru, Co, Mo, W, Ni, Ir Rh, Os, and the like, or combinations thereof, and but are not limited thereto. In some embodiments, a metal halide precursor (e.g., fluoride, chloride, bromide, or iodide of the metal material) or a metal organic precursor (including an organic ligand (e.g., $-OC_{1-16}$, $-CO$, -acac, or the like) and the metal material) may be used for the selective deposition process or the super conformal deposition process. When the metal organic precursor is used, impurities such as carbon (C), nitrogen (N), oxygen (O), or combinations thereof may be included in an amount ranging from about 0.001% to about 2% in the first metal material M1 filled into the trenches 121. An adhesion layer 29 (for example, but not limited to, metals, oxides, nitrides, and the like) is conformally deposited to cover the first ILD 12, the SACs 14, and the first metal material M1 so as to prevent the first metal material M1 from damage such as being stripped from the contacts spacers 20 and/or the sidewall portions of the protective liners 18 in the subsequent process (for example, CMP). A dielectric layer 30 (for example, but not limited to, silicon oxide, silicon nitride, silicon oxynitride, or combinations thereof) is deposited on the adhesion layer 29. A planarization technique such as CMP is then performed to remove the dielectric layer 30, the adhesion layer 29 and excess of the first metal material M1 above the first ILD layer 12, and the first metal material M1 remaining in the trenches 121 is etched back by a suitable etching process known to those skilled in the art of semiconductor fabrication (for example, but not limited to, a dry etching process) so as to form the lower metal contacts 191, which have a height less than the depth of the trenches 121. The conductive contacts 17 are separated from the lower metal contacts 191 by the protective liners 18, respectively. The bottom portions of the protective liners 18 are disposed between the conductive contacts 17 and the lower metal contacts 191, respectively. In some embodiments, the lower metal contacts 191 may be formed directly on the protective liners 18 by controlling the time period of the selective deposition process, the super conformal deposition process, or the like.

Referring to FIG. 2, the method 100 then proceeds to block 104, where upper metal contacts are formed. Referring to the examples illustrated in FIGS. 9, 10 and 11, a second metal material M2 is filled into the trenches 121 by a suitable deposition process known to those skilled in the art of semiconductor fabrication, for example, but not limited to, PVD, sputtering, selective CVD, CVD, selective ALD, ALD, or the like. Examples of the second metal material M2 include Ru, Co, Mo, W, Ni, Ir, Rh, Os, and the like, or combinations thereof, and but are not limited thereto. A planarization technique such as CMP or etching back is then performed to remove excess of the second metal material M2 above the first ILD layer 12 so as to form the upper metal contacts 192. The second metal material M2 for forming the upper metal contacts 192 should be different from the first metal material M1 for forming the lower metal contacts 191. The upper metal contacts 192 are in contact with and cooperate with the lower metal contacts 191, respectively, to form hybrid metal contact structures 19'. Each of the upper metal contacts 192 has a bottom surface with a dimension which is the same as a dimension of a top surface of a corresponding one of the lower metal contacts 191.

Referring to FIG. 2, the method 100 then proceeds to block 105, where a first via contact is formed, and block 106, where a second via contact is formed. Referring the example illustrated in FIG. 12, the MCESL 21 is formed on the first ILD layer 12. The formation and the material of the MCESL 21 are the same as or similar to those of the MCESL 21 described above for the semiconductor device 1 with reference to FIG. 1, and thus details thereof are omitted for the sake of brevity. The second ILD layer 22 is formed on the MCESL 21. The formation and the material of the second ILD layer 22 are the same as or similar to those of the second ILD layer 22 described above for the semiconductor device 1 with reference to FIG. 1, and thus details thereof are omitted for the sake of brevity.

The first via contact 23 is formed in the second ILD layer 22 and penetrates through the MCESL 21 so as to be electrically connected to the upper metal contact 192 of a corresponding one of the hybrid metal contact structures 19'. The first via contact 23 has a horizontal cross-section area less than a contact area between the upper metal contacts 192 and the lower metal contacts 191. In some embodiments, formation of the first via contact 23 includes the following steps. First, a via opening is formed through the second ILD layer 22 and MCESL 21 to expose the upper metal contact 192 of the corresponding one of the hybrid metal contact structures 19' from the via opening. After formation of the via opening, the first via contact 23 is formed by depositing a metal material to fill the via opening and then removing excess of the metal material by a planarization technique, such as CMP. In some embodiments, the metal material may include, for example, but not limited to, Ru, Co, Mo, W, Ni, Ir, Rh, Os, and the like, or combinations thereof. The metal material for forming the first via contact 23 should be the same as that for forming the upper metal contacts 192. In some embodiments, deposition of the metal material for forming the first via contact 23 may be conducted by a suitable technique known to those skilled in the art of semiconductor fabrication, for example, but not limited to, CVD, PECVD, ALD, PEALD, selective CVD, selective ALD, super conformal ALD, super conformal CVD, or other suitable deposition techniques. In some embodiments, a metal halide precursor (e.g., fluoride, chloride, bromide, or iodide of the metal material) or a metal organic precursor (including an organic ligand (e.g., $-OC_{1-16}$, $-CO$, -acac, or the like) and the metal material) may be used for the selective CVD or the selective ALD. When the metal organic precursor is used, impurities such as carbon (C), nitrogen (N), oxygen (O), or combinations thereof may be included in the first via contact 23 in an amount ranging from 0.001% to 2%.

The second via contact 24 is formed in the second ILD layer 22 and penetrates through the MCESL 21 and a corresponding one of the SACs 14 to be electrically connected to a corresponding one of the gate structures 13. In some embodiments, formation and material of the second via contact 24 may be the same as or similar to those of the first via contact 23. In some embodiments, the second via contact 24 may be configured as a single layer structure including two different metal materials. In some embodiments, the second via contact 24 may be configured as a two layered structure, in which one layer includes a metal material different from the metal material of the other layer. The second via contact 24 may be formed with or without seam therein. The first via contact 23 and the second via contact 24 may be formed simultaneously or separately.

Figure 14:
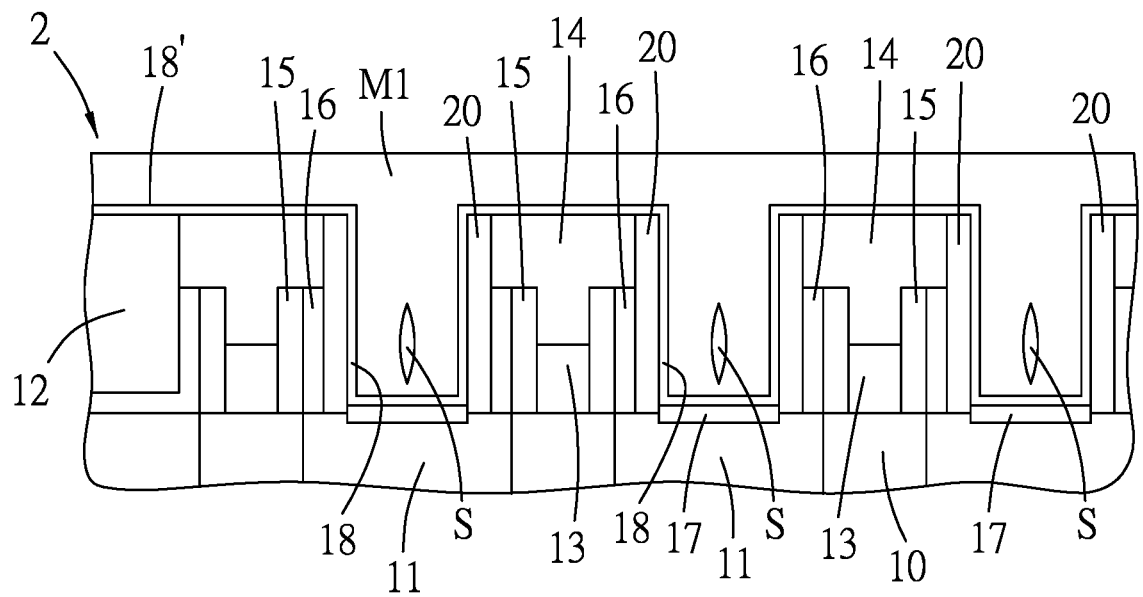
FIGS. 14 to 17 are schematic views illustrating intermediate stages of a method for manufacturing the semiconductor device in accordance with some embodiments.
Figure 15:
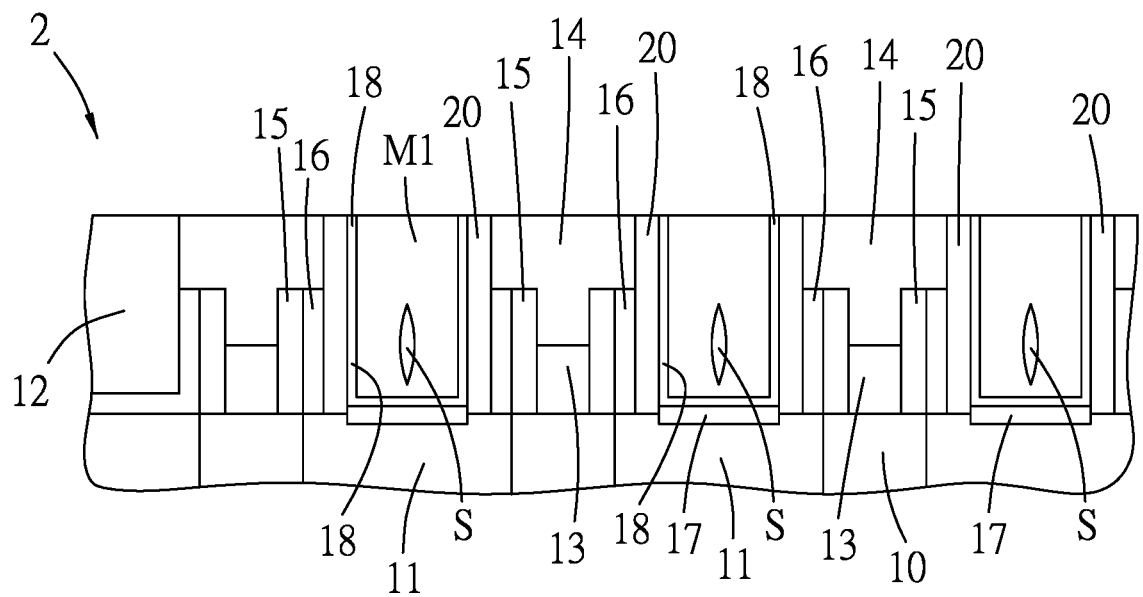
Figure 16:
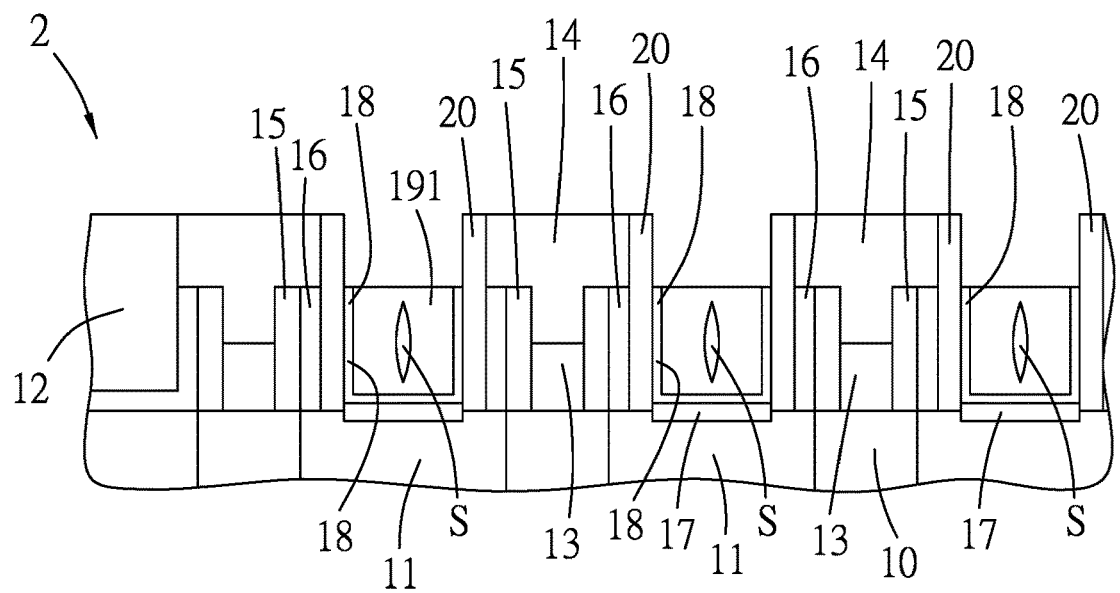
Figure 17:
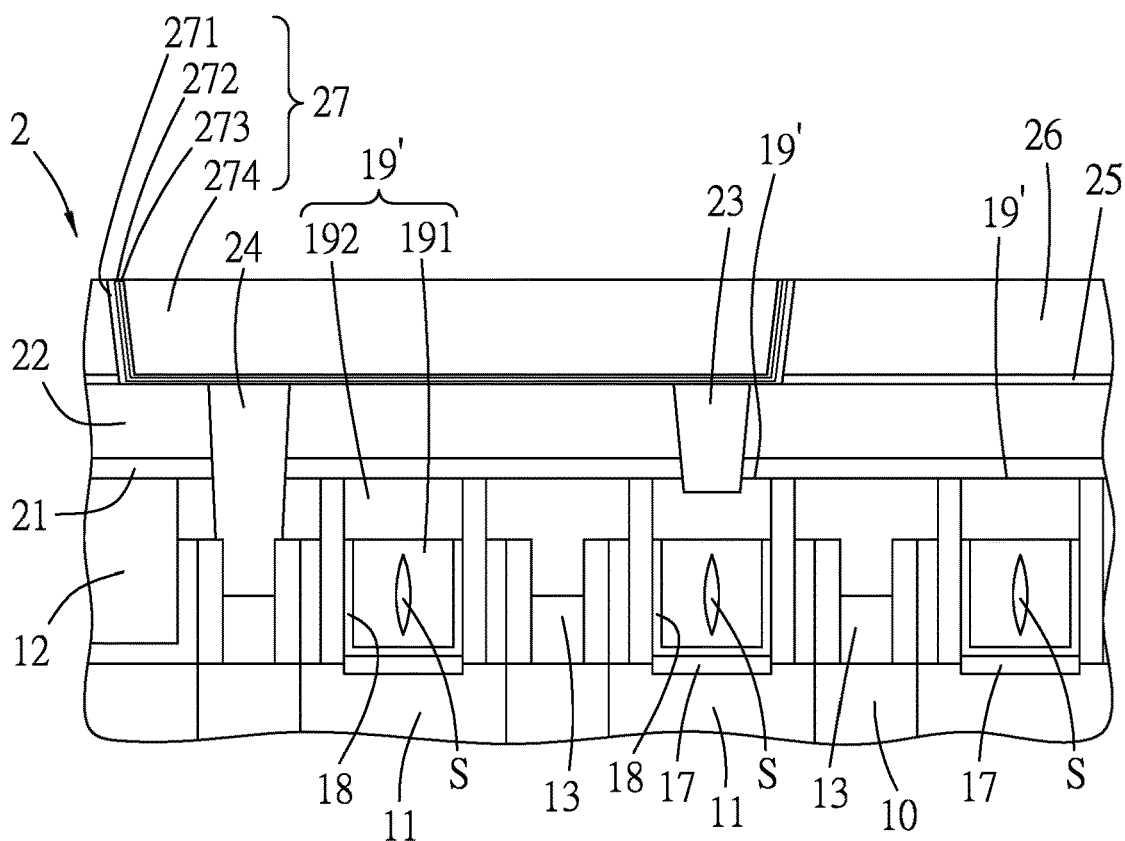

Referring to FIG. 2, the method 100 then proceeds to block 107, where a metal line is formed. Referring the example illustrated in FIG. 13, the etch stop layer 25 is formed on the second ILD layer 22, the dielectric layer 26 is formed on the etch stop layer 25, and the metal line 27 is formed in the dielectric layer 26 to be electrically connected to the upper metal contact 192 of the corresponding one of the hybrid metal contact structures 19' through the first via contact 23 or electrically connected to a corresponding one of the gate structures 13 through the second via contact 24. Details of the formations and the materials of the etch stop layer 25, the dielectric layer 26, the metal line 27 are described above for the semiconductor device 1 with reference to FIG. 1, and thus are omitted for the sake of brevity In some embodiments, formation of the lower metal contacts 191 and formation of the protective liners 18 are performed simultaneously. Referring to the examples illustrated in FIGS. 5 and 14, the first metal material M1 is deposited on the protective layer 18' and filled into the trenches 121 by a deposition process (for example, but not limited to, CVD, PECVD, ALD, PEALD, or the like) other than the selective deposition process or the super conformal deposition process. Examples of the first metal material M1 include Ru, Co, Mo, W, Ni, Ir, Rh, Os, and the like, and combinations thereof, but are not limited thereto. The first metal material M1 for forming the lower metal contacts 191 is the same as the metal material for forming the protective liners 18. Since a deposition process other than the selective deposition process or the super conformal deposition process is used for depositing the first metal material M1, seams (S) may be formed in the first metal material M1 filled in the trenches 121. The heights of the seams (S) will be increased with an increase of the CO of the lower metal contacts 191 to be formed. Referring to the examples illustrated in FIGS. 14 and 15, a planarization technique such as CMP is then performed to remove excess of the first metal material M1 and top portions of the protective layer 18' above the first ILD layer 12. Referring to the examples illustrated in FIGS. 15 and 16, the first metal material M1 and the protective layer 18' remaining in the trenches 121 are etched back by a suitable etching process known to those skilled in the art of semiconductor fabrication (for example, but not limited to, a dry etching process) to form the protective liners 18 and the lower metal contacts 191 simultaneously. The seams (S) may be formed in the lower metal contacts 191. Since the first metal material M1 for forming the lower metal contacts 191 is the same as the metal material for forming the protective liners 18, the top surfaces of the lower metal contacts 191 and the top surfaces of the sidewall portions of the protective liners 18 are flush with each other due to no difference in the etching selectivity between the first metal material M1 for forming the lower metal contacts 191 and the metal material for forming the protective liners 18. Therefore, in the semiconductor device 2 formed at the stage illustrated in FIG. 17, each of the hybrid metal contact structures 19' includes the lower metal contact 191 which may be formed with the seam (S), and the upper metal contact 192 which is disposed on the lower metal contact 191 and the protective liner 18.

Figure 18:
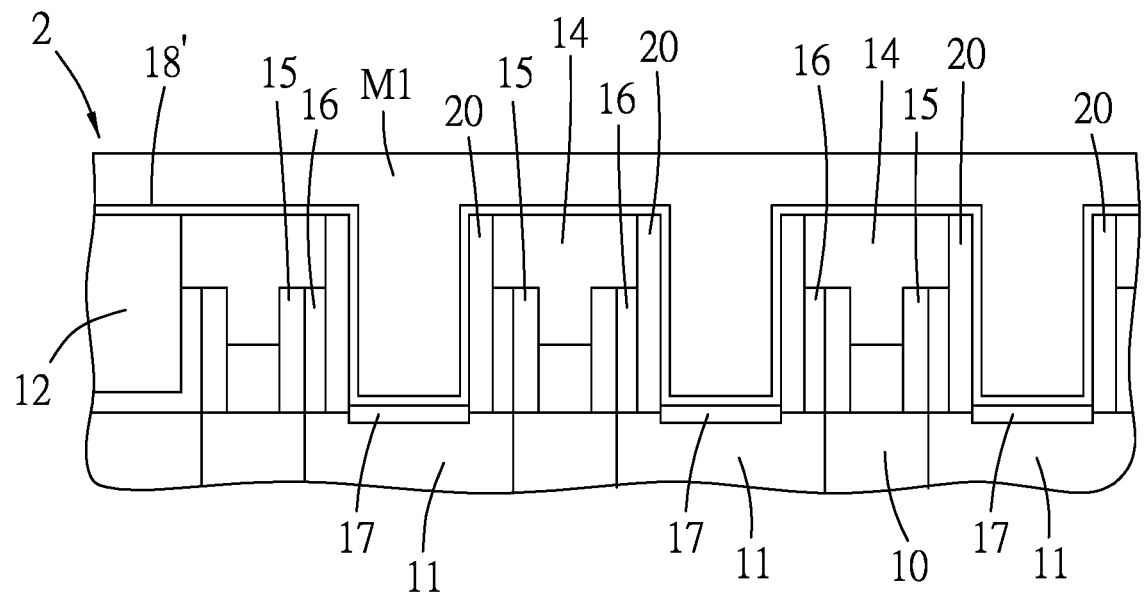
FIGS. 18 to 20 are schematic views illustrating intermediate stages of a method for manufacturing the semiconductor device in accordance with some embodiments.
Figure 19:
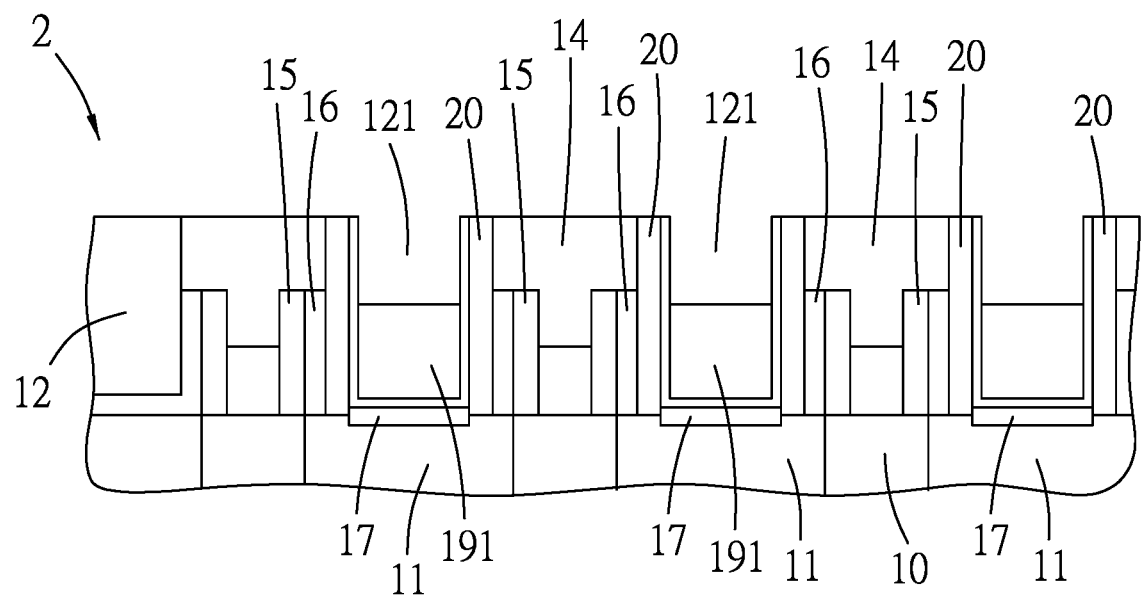
Figure 20:
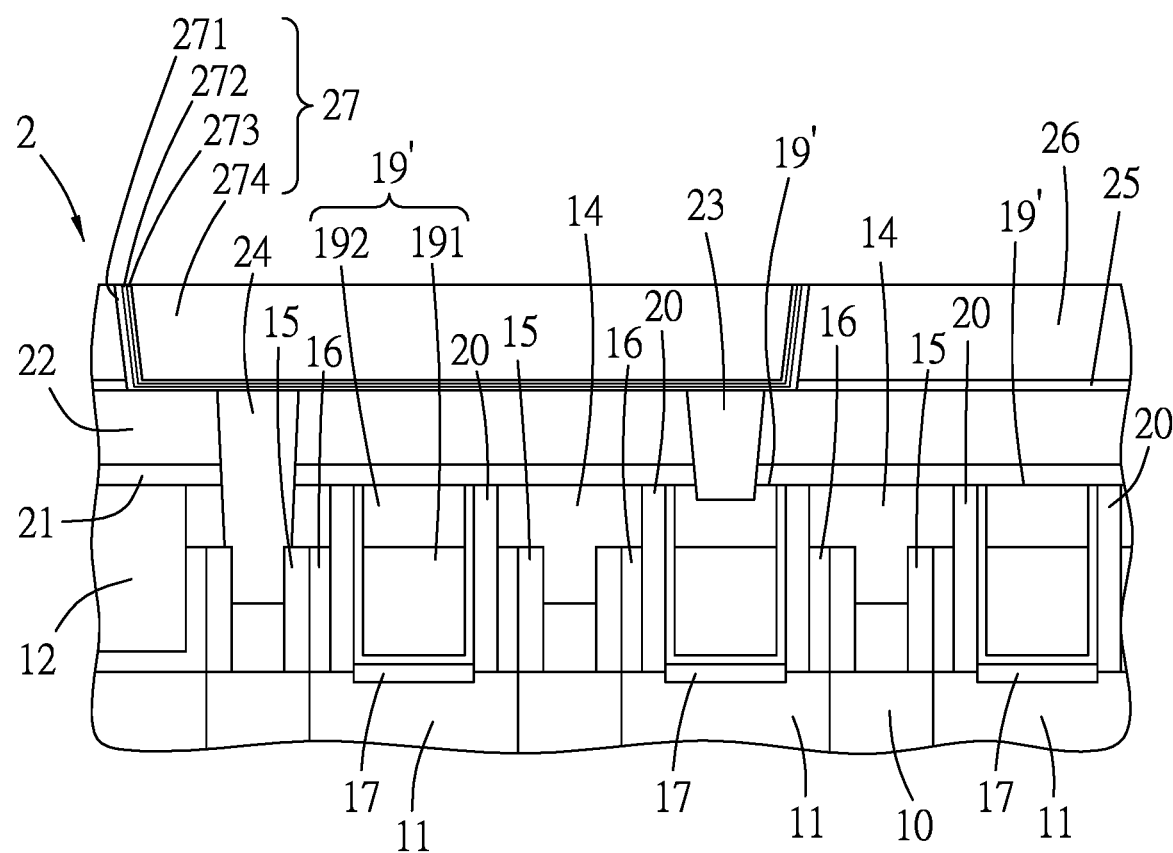

In some embodiments, formation of the lower metal contacts 191 and formation of the protective liners 18 are performed simultaneously. Referring to the examples illustrated in FIGS. 5 and 18, the first metal material M1 is deposited on the protective layer 18' and filled into the trenches 121 by the super conformal deposition process (for example, but not limited to, super conformal ALD or super conformal CVD). The protective layer 18' includes a metal material, for example, but not limited to, Ru, Co, Mo, W, Ni, Ir, Rh, Os, or the like, or combinations thereof, or nitrides of the metal material. Examples of the first metal material M1 include Ru, Co, Mo, W, Ni, Ir, Rh, Os, and the like, and combinations thereof, but are not limited thereto. The first metal material M1 for forming the lower metal contacts 191 is different from the metal material for forming the protective liners 18, and has a relatively high etching selectivity with respect to the metal material for forming the protective liners 18. Since the super conformal deposition process is used for depositing the first metal material M1, the first metal material M1 filled in the trenches 121 is not formed with seams. Referring to the examples illustrated in FIGS. 18 and 19, a planarization technique such as CMP is then performed to remove excess of the first metal material M1 and top portions of the protective layer 18' above the first ILD layer 12. The first metal material M1 remaining in the trenches 121 is then selectively etched back by a suitable etching process known to those skilled in the art of semiconductor fabrication (for example, but not limited to, a dry etching process) based on the relatively high etching selectivity of the first metal material M1 with respect to the metal material for forming the protective liners 18, so as to form the protective liners 18 and the lower metal contacts 191. The top surfaces of the lower metal contacts 191 are lower than those of the sidewall portions of the protective liners 18. Therefore, in the semiconductor device 2 formed at the stage illustrated in FIG. 20, each of the hybrid metal contact structures 19' includes the lower metal contact 191 which is not formed with the seam therein, and the upper metal contact 192 which is disposed on the lower metal contact 191. The upper and lower metal contacts 192 and 191 of each of the hybrid metal contact structures 19' are laterally covered by the sidewall portion of a corresponding one of the protective liners 18.

Figure 21:
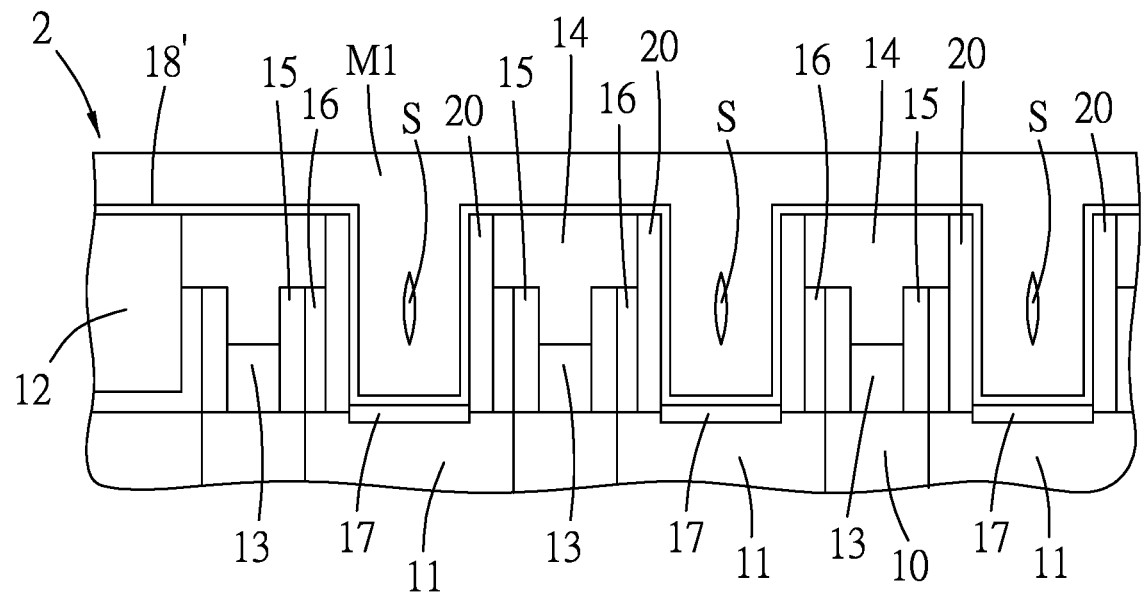
FIGS. 21 to 23 are schematic views illustrating intermediate stages of a method for manufacturing the semiconductor device in accordance with some embodiments.
Figure 22:
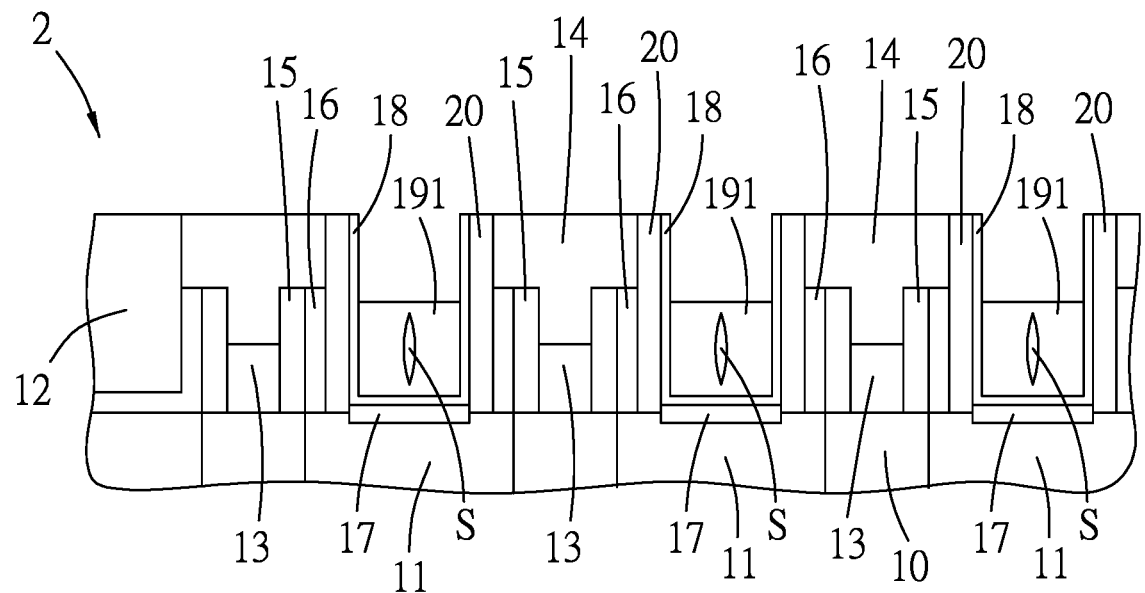
Figure 23:
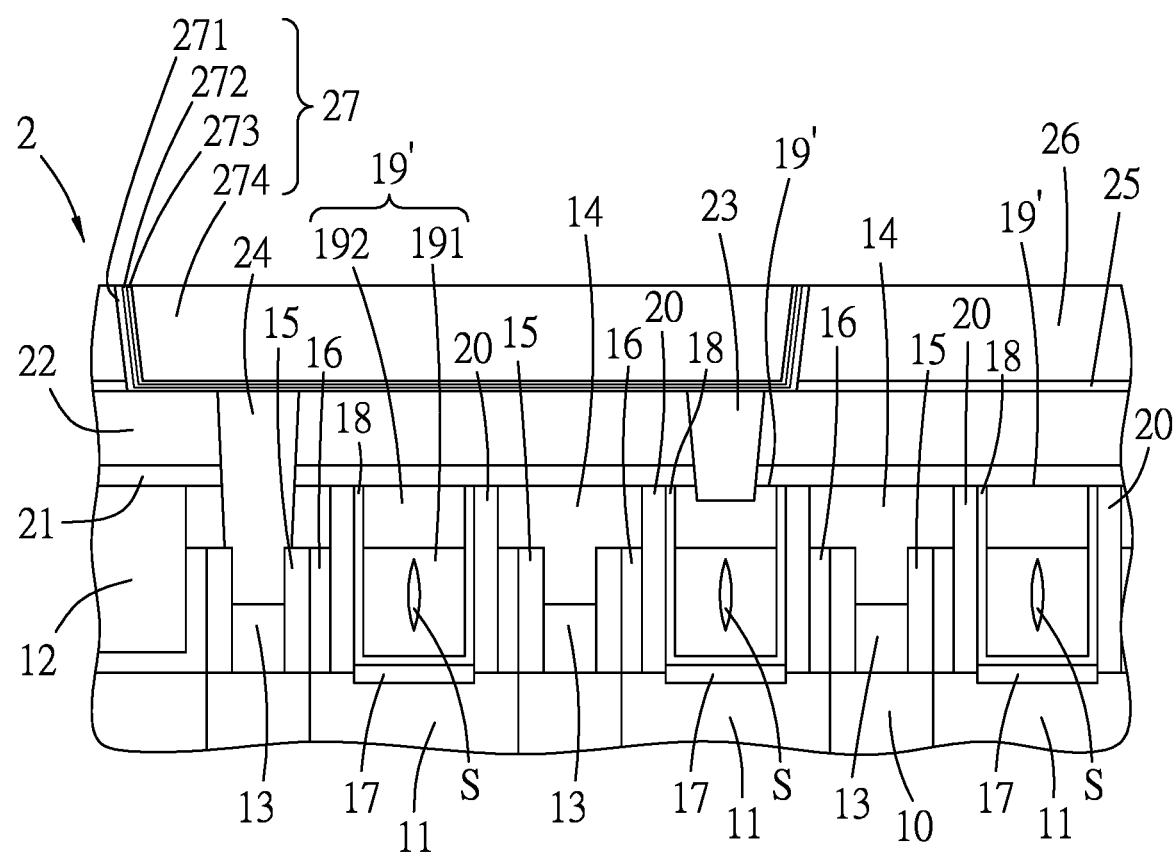

In some embodiments, formation of the lower metal contacts 191 and formation of the protective liners 18 are performed simultaneously. Referring to the examples illustrated in FIGS. 5 and 21, the first metal material M1 is deposited on the protective layer 18' and filled into the trenches 121 by a deposition process (for example, but not limited to, CVD, PECVD, ALD, PEALD, or the like) other than the selective deposition process or the super conformal deposition process. The protective layer 18' includes a metal material, for example, but not limited to, Ru, Co, Mo, W, Ni, Ir, Rh, Os, or the like, or combinations thereof, or nitrides of the metal material. Examples of the first metal material M1 include Ru, Co, Mo, W, Ni, Ir, Rh, Os, and the like, and combinations thereof, but are not limited thereto. The first metal material M1 for forming the lower metal contacts 191 is different from the metal material for forming the protective liners 18, and has a relatively high etching selectivity with respect to the metal material for forming the protective liners 18. Since a deposition process other than the selective deposition process or the super conformal deposition process is used for depositing the first metal material M1 the seams (S) may be formed in the first metal material M1 filled in the trenches 121. Referring to the examples illustrated in FIGS. 21 and 22, a planarization technique such as CMP is then performed to remove excess of the first metal material M1 and top portions of the protective layer 18' above the first ILD layer 12. The first metal material M1 remaining in the trenches 121 is then selectively etched back by a suitable etching process known to those skilled in the art of semiconductor fabrication (for example, but not limited to, a dry etching process) based on the relatively high etching selectivity of the first metal material M1 with respect to the metal material for forming the protective liners 18, so as to form the protective liners 18 and the lower metal contacts 191. The top surfaces of the lower metal contacts 191 are lower than those of the sidewall portions of the protective liners 18, and the seams (S) may be formed in the lower metal contacts 191. Therefore, in the semiconductor device 2 formed at the stage illustrated in FIG. 23, each of the hybrid metal contact structures 19' includes the lower metal contact 191 which may be formed with the seam (S) therein, and the upper metal contact 192 which is disposed on the lower metal contact 191. The upper and lower metal contacts 192, 191 of each of the hybrid metal contact structures 19' are laterally covered by the sidewall portion of a corresponding one of the protective liners 18.

Figure 24:
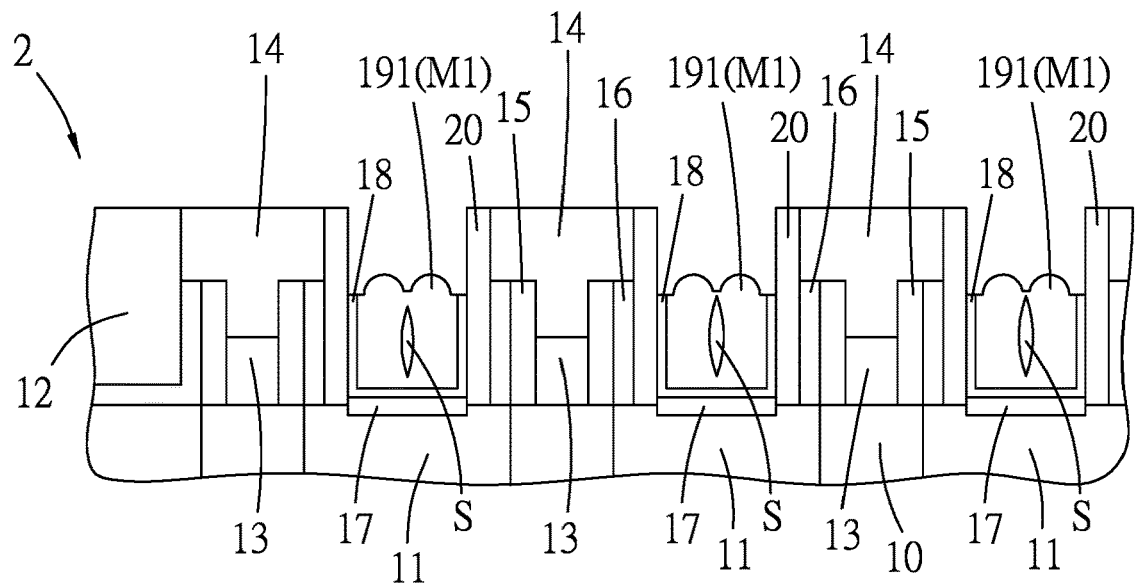
FIGS. 24 and 25 are schematic views illustrating intermediate stages of a method for manufacturing the semiconductor device in accordance with some embodiments.
Figure 25:
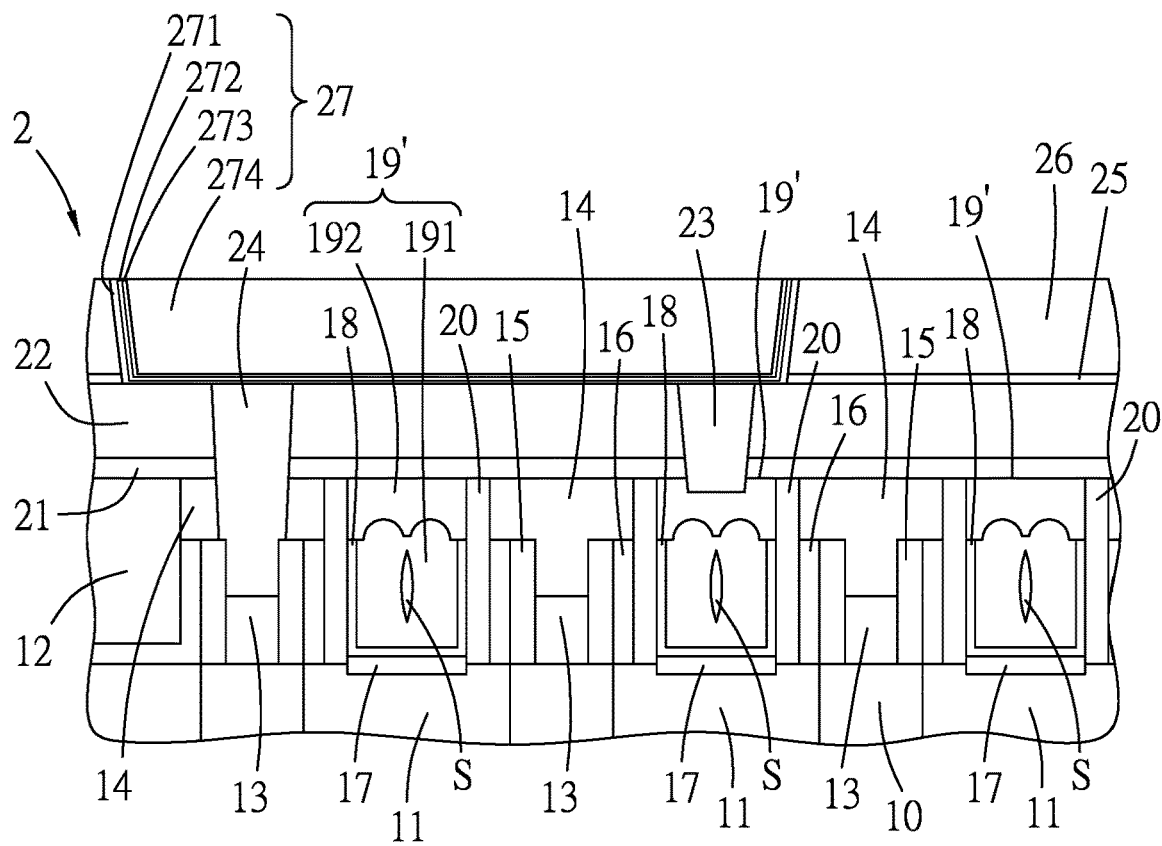

In some embodiments, the lower metal contacts 191 are formed directly on the protective liners 18 by a selective deposition process. Referring to the examples illustrated in FIGS. 7 and 24, after the protective liners 18 are formed, the lower metal contacts 191 having a height less than the depth of the trenches 121 are directly formed on the protective liners 18 by depositing the first metal material M1 on the protective liners 18 using the selective deposition process (for example, but not limited to, selective CVD or selective ALD) for a controlled time period. Examples of the first metal material M1 include Ru, Co, Mo, W, Ni, Ir, Rh, Os, and the like, and combinations thereof, but are not limited thereto. The seams (S) may be formed in the lower metal contacts 191. Therefore, in the semiconductor device 2 formed at the stage illustrated in FIG. 25, each of the hybrid metal contact structures 19' includes the lower metal contact 191 which is formed with the seam (S) therein, and the upper metal contact 192 which is disposed on the lower metal contact 191 and the protective liner 18. The lower metal contact 191 of each of the hybrid metal contact structures 19' is laterally covered by the sidewall portion of a corresponding one of the protective liners 18.

Figure 26:
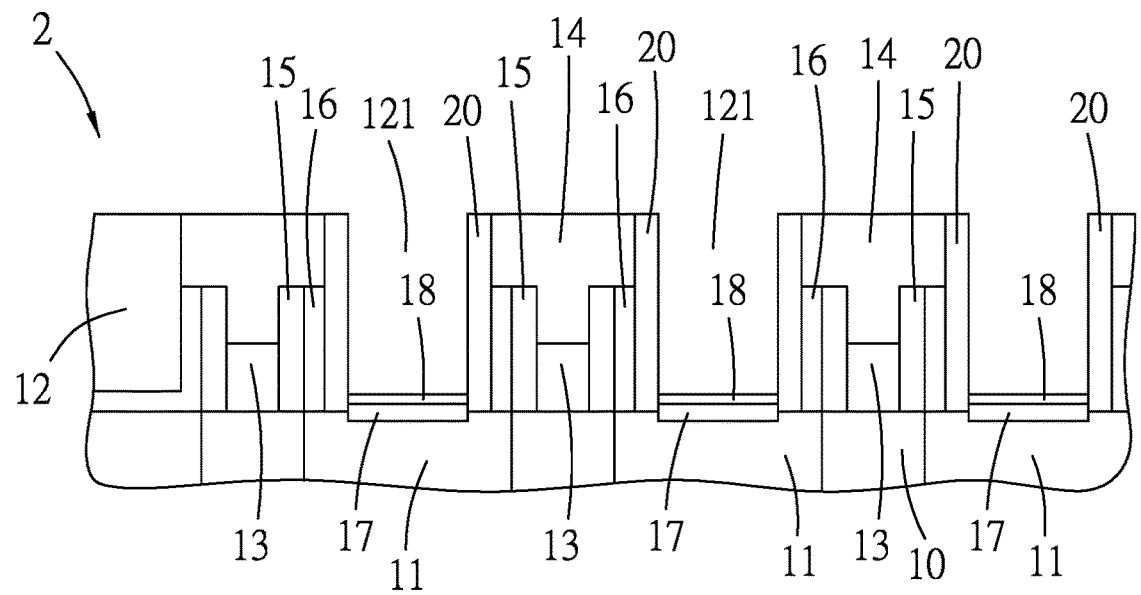
FIGS. 26 and 27 are schematic views illustrating intermediate stages of a method for manufacturing the semiconductor device in accordance with some embodiments.
Figure 27:
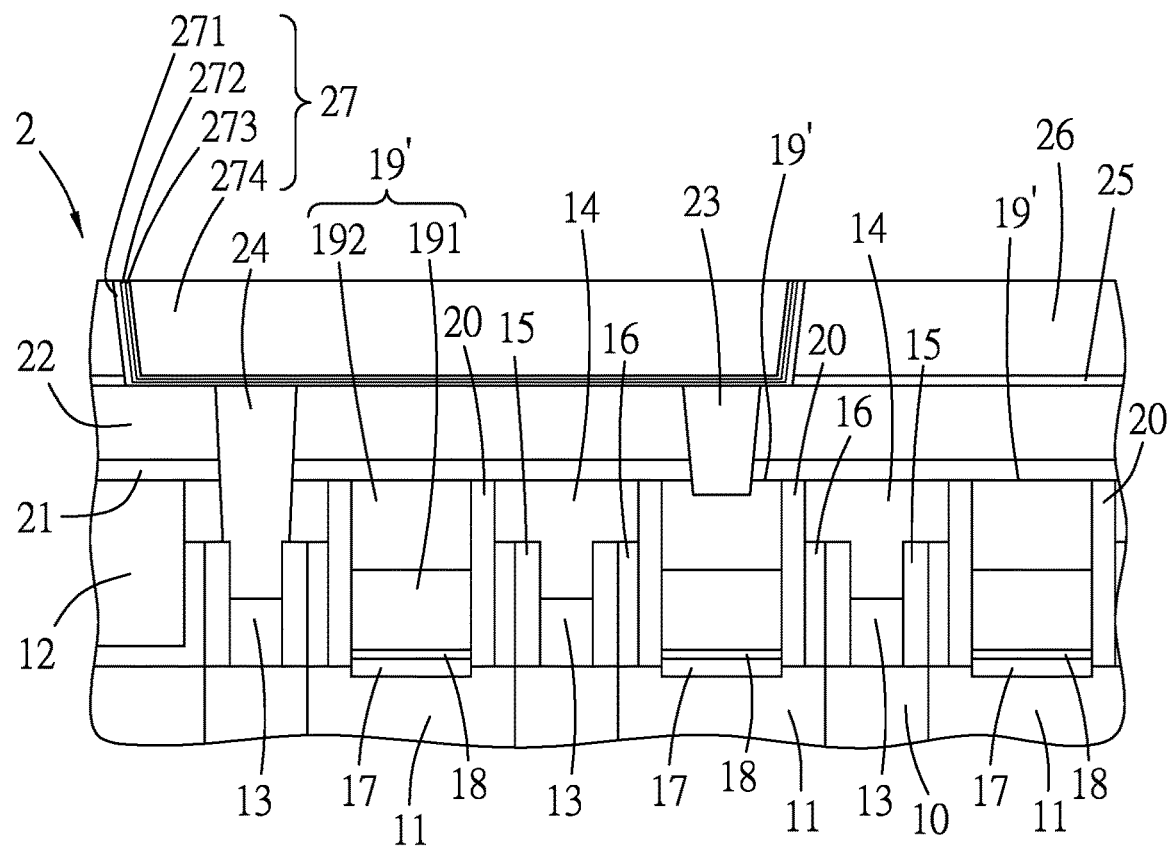

In some embodiments, the protective liners 18 may be formed directly on the conductive contacts 17 by a selective deposition process. Referring to the examples illustrated in FIGS. 4 and 26, after the conductive contacts 17 are formed, the protective liners 18 are directly formed on the conductive contacts 17 by the selective deposition process (for example, but not limited to, selective CVD or selective ALD). In some embodiments, nucleation sides may be formed on the contact spacers 20 due to loss of selectivity during the selective deposition process. In some embodiments, the protective liners 18 may have a thickness ranging from about 0.5 nm to about 10.0 nm. When the thickness of the protective liners 18 is less than 0.5 nm, the conductive contacts 17 may not be protected effectively by the protective liners 18 during the subsequent stages of the manufacturing method of the semiconductor device 2. When the thickness of the protective liners 18 is greater than 10.0 nm, the resistance attributed by the protective liners 18 may be increased undesirably. In the semiconductor device 2 formed at the stage illustrated in FIG. 27, each of the protective liners 18 is configured as a flat layer disposed on a corresponding one of the conductive contacts 17, and each of the hybrid metal contact structures 19' includes the lower metal contact 191 disposed on a corresponding one of the protective liners 18 and the upper metal contact 192 disposed on the lower metal contact 191.

Figure 28:
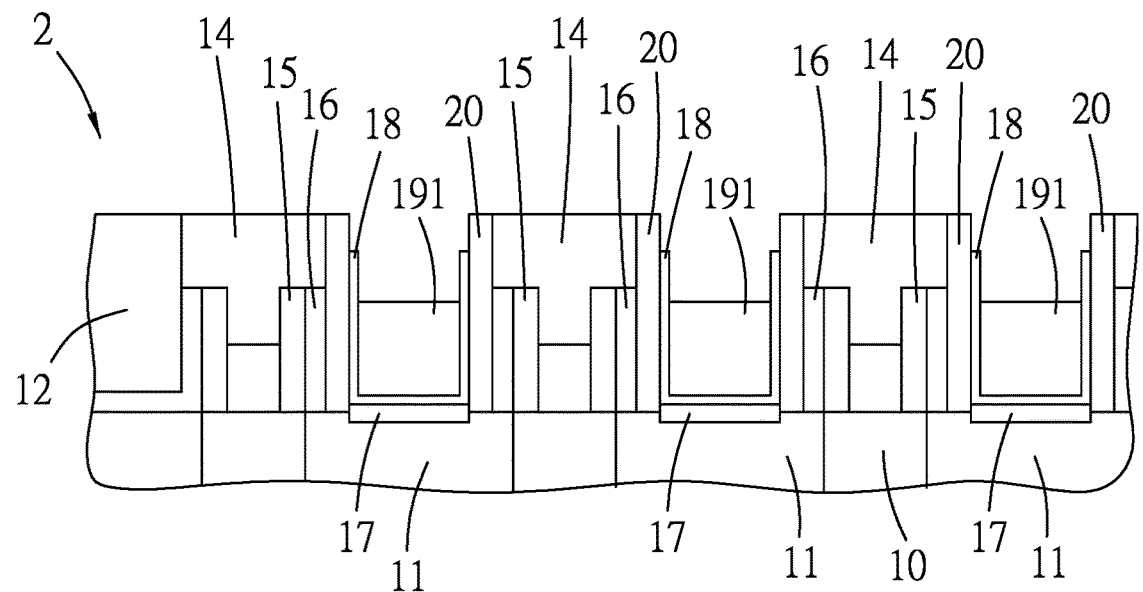
FIGS. 28 and 29 are schematic views illustrating intermediate stages of a method for manufacturing the semiconductor device in accordance with some embodiments.
Figure 29:
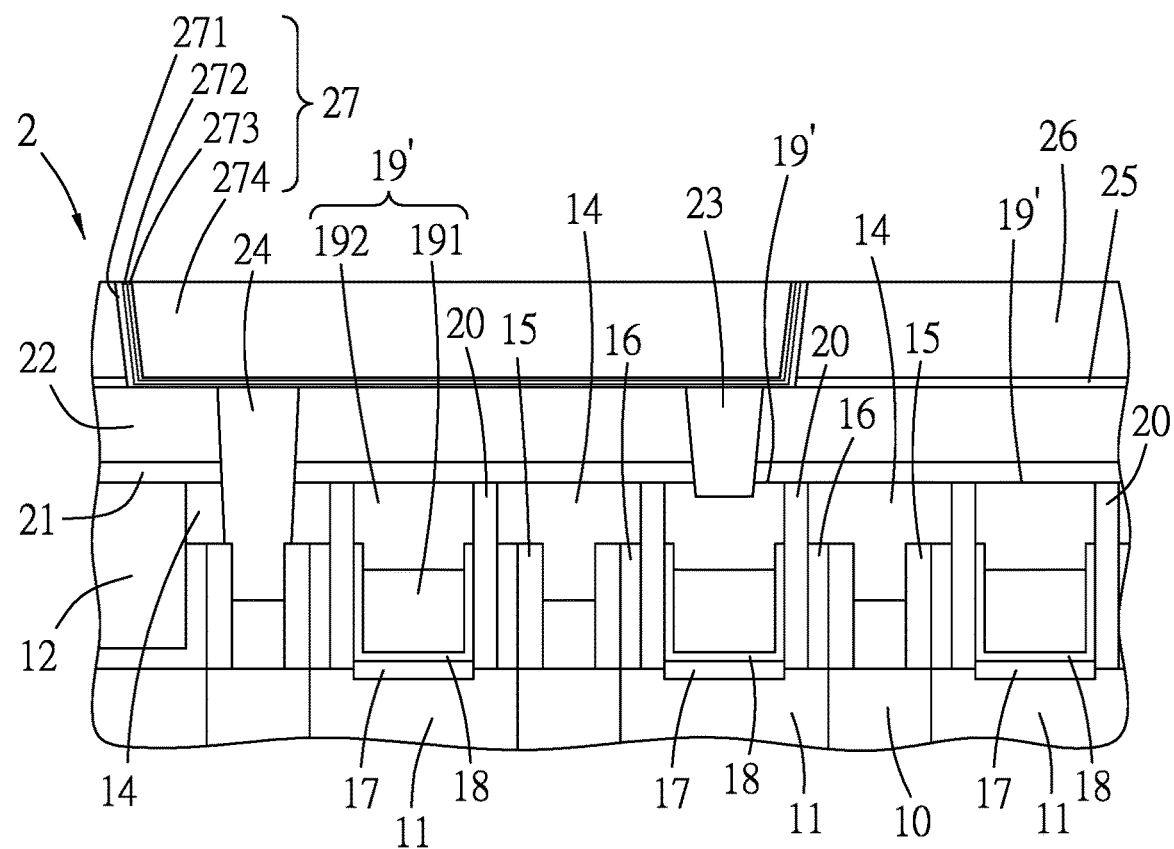
Figure 30:
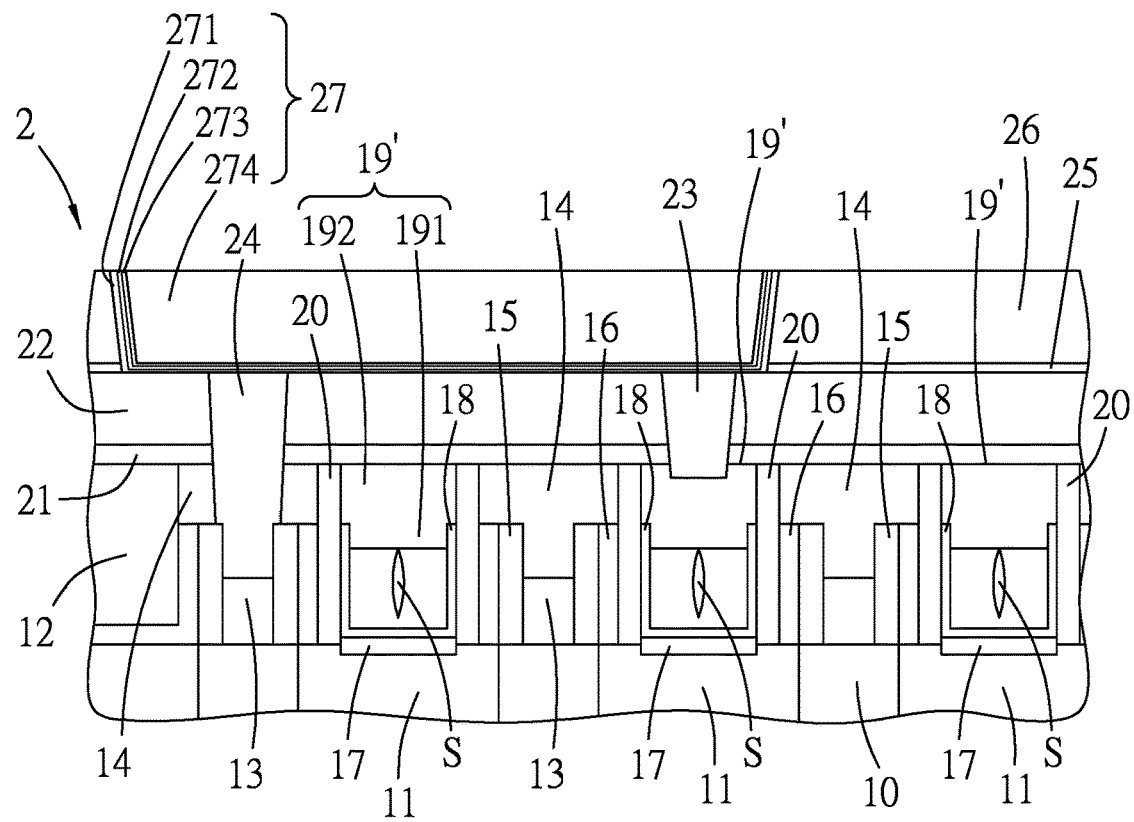
FIG. 30 is a schematic view illustrating an intermediate stage of a method for manufacturing the semiconductor device in accordance with some embodiments.

In some embodiments, the protective liners 18 and the lower metal contacts 191 may be formed separately by different selective etching back processes using different etchants. Referring to the example illustrated in FIG. 28, after the excess of the first metal material M1 and the top portions of the protective layer 18' above the first ILD layer 12 are removed by the planarization technique such as CMP, the protective liners 18 are formed by selectively etching back the protective layers 18' remaining in the trenches 121 using a first etchant based on a relatively high etching selectivity of the protective layer 18' with respect to the first metal material M1. The lower metal contacts 191 are formed by selectively etching back the first metal material M1 remaining in the trenches 121 using a second etchant based on a relatively high etching selectivity of the first metal material M1 with respect to the protective layer 18'. For example, when the protective layer 18' is made of titanium nitride and the first metal material M1 is ruthenium, the protective liners 18 may be formed by selectively etching back the protective layers 18' remaining in the trenches 121 using chlorine gas as the first etchant, and the lower metal contacts 191 may be formed by selectively etching back the first metal material M1 remaining in the trenches 121 using oxygen gas as the second etchant. The protective liners 18 may be formed before or after the lower metal contacts 191 are formed. The top surfaces of the sidewall portions of the protective liners 18 are lower than a top surface of the first ILD layer 12, and higher than top surfaces of the lower metal contacts 191. Therefore, in each of the hybrid metal contact structures 19' in the semiconductor device 2 formed at the stage illustrated in FIG. 29, the lower metal contact 191 is disposed on a corresponding one of the protective liners 18 and is laterally covered by the sidewall portion of the corresponding one of the protective liners 18, and the upper metal contact 192 is disposed on the lower metal contact 191 and a lower portion of the upper metal contact 192 is laterally covered by the sidewall portion of the corresponding one of the protective liners 18. In addition, the sidewall portions of the protective liners 18 in the semiconductor device 2 formed at the stage illustrated in FIG. 29 have a height lower than that of the sidewall portions of the protective liners 18 in the semiconductor device 2 formed at the stage illustrated in FIG. 20, in which the protective liners 18 are formed without selectively etching back of the protective layers 18' remaining in the trenches 121. Similarly, referring to the example illustrated in FIG. 30, the sidewall portions of the protective liners 18 in the semiconductor device 2 formed at this stage, in which the protective liners 18 and the lower metal contacts 191 are formed separately by different selective etching back processes using different etchants, have a height lower than that of the sidewall portions of the protective liners 18 in the semiconductor device 2 formed at the stage illustrated in FIG. 23, in which the protective liners 18 are formed without selectively etching back of the protective layers 18' remaining in the trenches 121.

Figure 31:
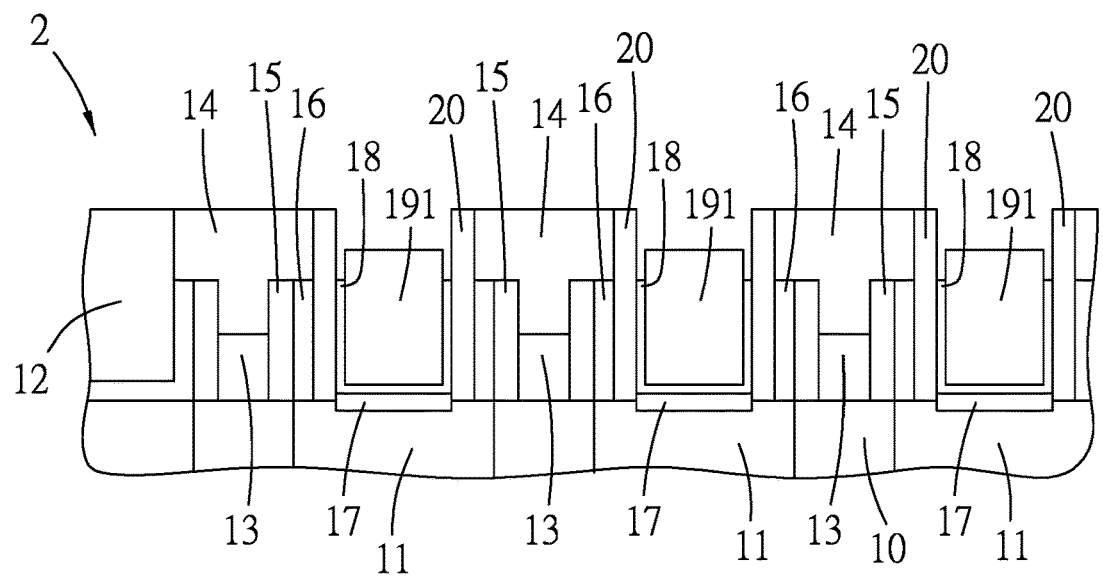
FIGS. 31 and 32 are schematic views illustrating intermediate stages of a method for manufacturing the semiconductor device in accordance with some embodiments.
Figure 32:
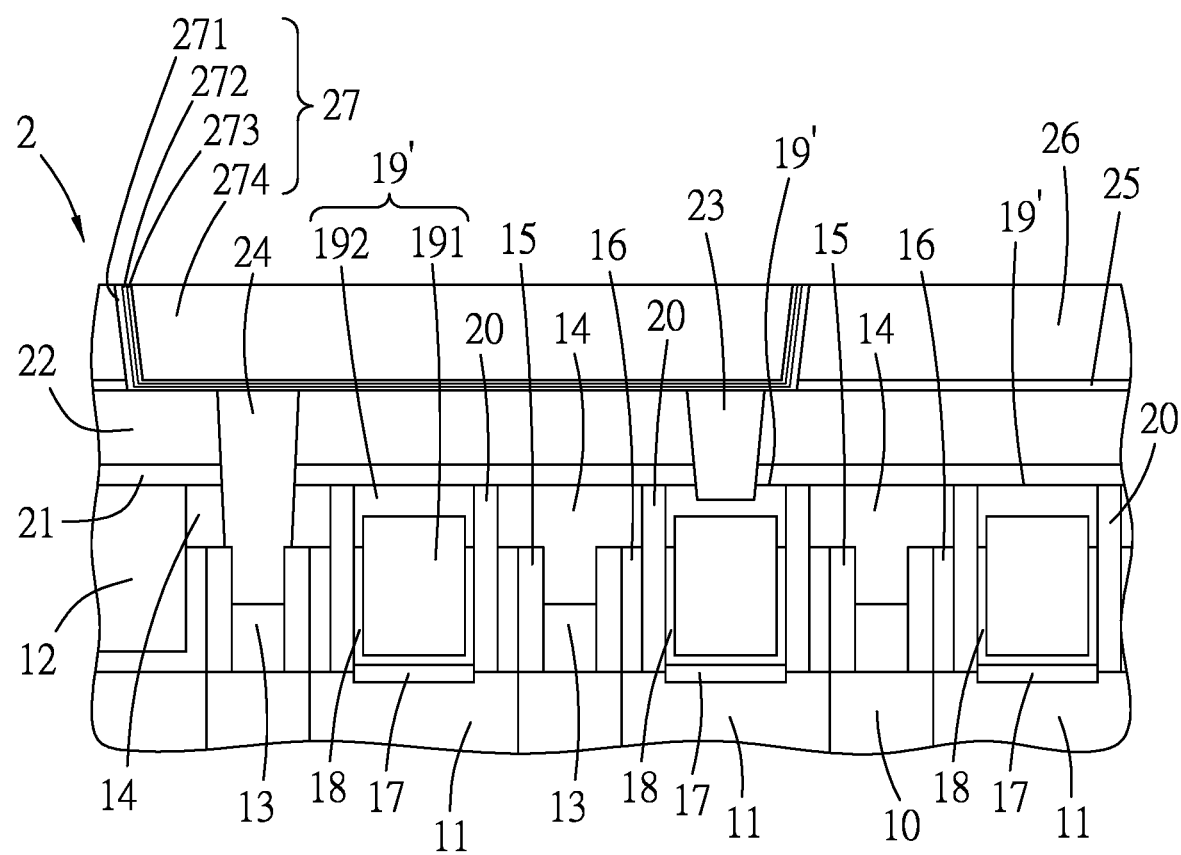
Figure 33:
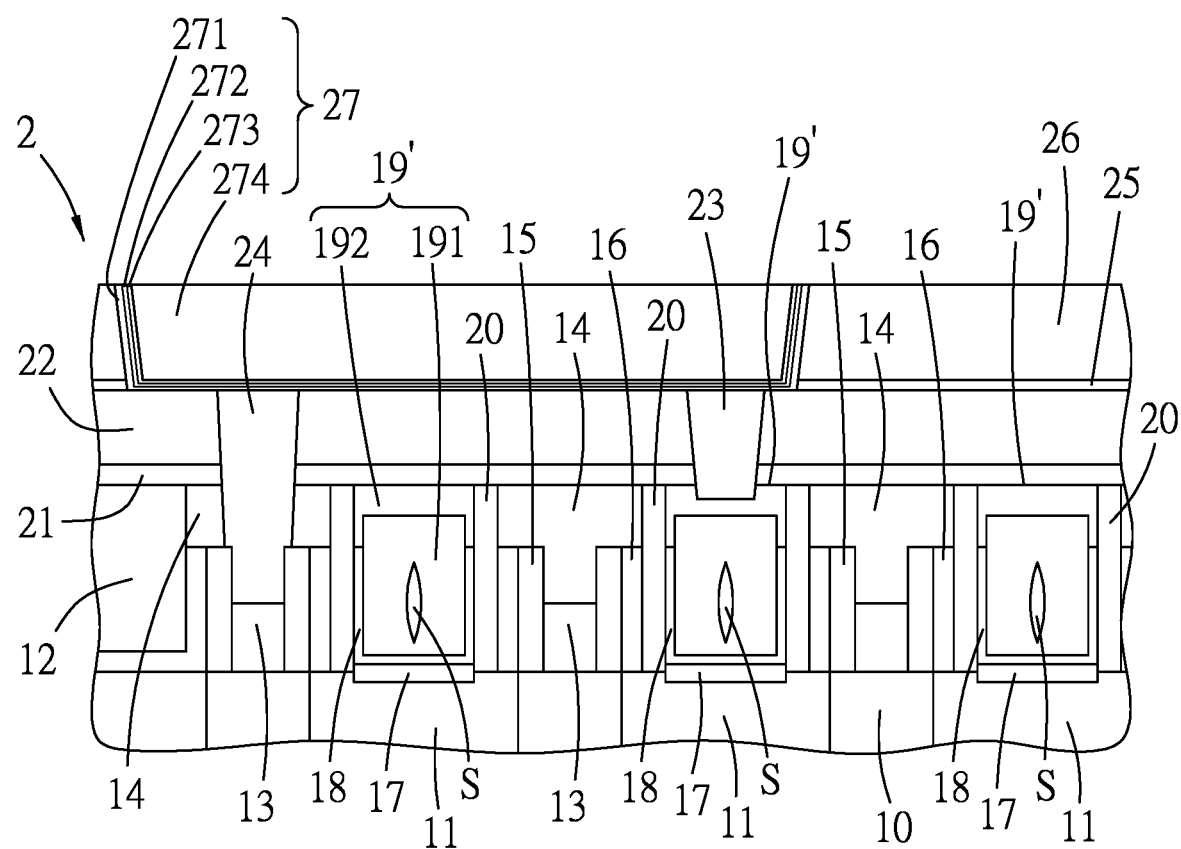
FIG. 33 is a schematic view illustrating an intermediate stage of a method for manufacturing the semiconductor device in accordance with some embodiments.

Referring to the example illustrated in FIG. 31, in some alternative embodiments, after the protective liners 18 and the lower metal contacts 191 are formed separately by different selective etching back processes using different etchants, the top surfaces of the sidewall portions of the protective liners 18 are lower than the top surfaces of the lower metal contacts 191, and the top surfaces of the lower metal contacts 191 are lower than the top surface of the first ILD layer 12. Therefore, in each of the hybrid metal contact structures 19' in the semiconductor device 2 formed at the stage illustrated in FIG. 32, the lower metal contact 191 is disposed on a corresponding one of the protective liners 18 and a top portion thereof protrudes upwardly out of the sidewall portion of the corresponding one of the protective liners 18, and the upper metal contact 192 is disposed on the lower metal contact 191 and a lower portion thereof laterally covers the top portion of lower metal contact 191. In addition, the sidewall portions of the protective liners 18 in the semiconductor device 2 formed at the stage illustrated in FIG. 32 have a height lower than that of the sidewall portions of the protective liners 18 in the semiconductor device 2 formed at the stage illustrated in FIG. 20, in which the protective liners 18 are formed without selectively etching back of the protective layers 18' remaining in the trenches 121. Similarly, referring to the example illustrated in FIG. 33, the sidewall portions of the protective liners 18 in the semiconductor device 2 formed at this stage, in which the protective liners 18 and the lower metal contacts 191 are formed separately by different selective etching back processes using different etchants, have a height lower than that of the sidewall portions of the protective litters 18 in the semiconductor device 2 formed at the stage illustrated in FIG. 23, in which the protective liners 18 are formed without selectively etching back of the protective layers 18' remaining in the trenches 121.

Compared with the semiconductor device 1 illustrated in FIG. 1, in which the metal material for forming the first via contact 23 is different from that for forming the metal contacts 19, the metal material for forming the first via contact 23 in the semiconductor device 2 illustrated in FIGS. 13, 17, 20, 23, 25, 27, 29, 30, 32, and 33 is the same as that for forming the upper metal contacts 192, therefore, there is no interface resistance between the first via contact 23 and a corresponding one of the upper metal contacts 192. In addition, compared with the interface between the first via contact 23 and the corresponding one of the metal contacts 19 in the semiconductor device 1, the interface between the upper metal contact 192 and the lower metal contact 191 in the semiconductor device 2 has a relatively large contact area, and thus, the interface resistance between the upper metal contact 192 and the lower metal contact 191 of a corresponding one of the hybrid metal contact structures 19' that is electrically connected to the first via contact 23 may be reduced compared to that between the first via contact 23 and the corresponding one of the metal contacts 19 in the semiconductor device 1. Furthermore, since the conductive contacts 17 are protected by the protective liners 18, they can be prevented from being damaged during the manufacturing method of the semiconductor device 2, thereby avoiding increase in the resistance of the semiconductor device 2 thus manufactured.

In accordance with some embodiments of the present disclosure, a method for manufacturing a semiconductor device includes: forming a lower metal contact in a trench of a first dielectric structure disposed on a substrate, the lower metal contact having a height less than a depth of the trench and being made of a first metal material; forming an upper metal contact to fill the trench and to be in contact with the lower metal contact, the upper metal contact being formed of a second metal material different from the first metal material and having a bottom surface with a dimension which is the same as a dimension of a top surface of the lower metal contact; forming a second dielectric structure on the first dielectric structure; and forming a via contact penetrating through the second dielectric structure to be electrically connected to the upper metal contact, the via contact being formed of a metal material which is the same as the second metal material.

In accordance with some embodiments of the present disclosure, the method for manufacturing the semiconductor device further includes, prior to forming the lower metal contact, forming a conductive contact on an active region in the substrate; and forming a protective liner on the conductive contact to separate the conductive contact from the lower metal contact.

In accordance with some embodiments of the present disclosure, formation of the protective liner includes: conformally depositing a protective layer on the first dielectric structure to cover the conductive contact; depositing a photoresist layer on the protective layer; etching back the photoresist layer to permit the photoresist layer to have a height less than the depth of the trench; after etching back the photoresist layer, removing a portion of the protective layer above the photoresist layer; and removing the photoresist layer.

In accordance with some embodiments of the present disclosure, formation of the lower metal contact is performed after forming the protective liner, and includes: selectively depositing the first metal material on the protective liner to fill the trench; and removing a top portion of the first metal material to permit the height of the lower metal contact to be less than the depth of the trench.

In accordance with some embodiments of the present disclosure, formation of the lower metal contact is performed after forming the protective liner, and includes selectively depositing the first metal material on the protective liner to directly form the lower metal contact having a height less than the depth of the trench.

In accordance with some embodiments of the present disclosure, formation of the lower metal contact and formation of the protective liner are performed simultaneously, and include: conformally depositing a protective layer on the first dielectric structure to cover the conductive contact; depositing the first metal material to fill the trench and to cover the protective layer; removing a portion of the first metal material and a portion of the protective layer above the first dielectric structure; and after removing the portion of the protective layer and the portion of the first metal material, etching back the first metal material in the trench.

In accordance with some embodiments of the present disclosure, formation of the protective liner includes selectively depositing a protective layer merely on the conductive contact.

In accordance with some embodiments of the present disclosure, formation of the lower metal contact is performed after forming the protective liner, and includes: depositing the first metal material to fill the trench and to cover the first dielectric structure and the protective liner; removing a portion of the first metal material above the first dielectric structure; and after removing the portion of the first metal material, etching back the first metal material in the trench.

In accordance with some embodiments of the present disclosure, formation of the upper metal contact includes depositing the second metal material on the lower metal contact to fill the trench and to cover the first dielectric structure; and removing a portion of the second metal material above the first dielectric structure.

In accordance with some embodiments of the present disclosure, a semiconductor device includes a first dielectric structure, a lower metal contact, an upper metal contact, a second dielectric structure, and a via contact. The lower metal contact is disposed in the first dielectric structure, has a height less than a height of the first dielectric structure, and is formed of a first metal material. The upper metal contact is disposed on and in contact with the lower metal contact in the first dielectric structure. The upper meal contact is formed of a second metal material different from the first metal material, and has a bottom surface with a dimension which is the same as a dimension of a top surface of the lower metal contact. The second dielectric structure is disposed on the first dielectric structure. The via contact penetrates through the second dielectric structure to be electrically connected to the upper metal contact, and is formed of a metal material which is the same as the second metal material.

In accordance with some embodiments of the present disclosure, the semiconductor device further includes a substrate including an active region, a conductive contact disposed on the active region, and a protective liner disposed on the conductive contact to separate the conductive contact from the lower metal contact.

In accordance with some embodiments of the present disclosure, the protective liner is formed of a metal material which is the same as the first metal material.

In accordance with some embodiments of the present disclosure, the protective liner is formed of a metal-containing material different from the first metal material.

In accordance with some embodiments of the present disclosure, the protective liner includes a bottom portion disposed between the conductive contact and the lower metal contact, and a sidewall portion extending upwardly from a periphery of the bottom portion to laterally cover the lower metal contact.

In accordance with some embodiments of the present disclosure, the sidewall portion of the protective liner has a height which is the same as a height of the lower metal contact.

In accordance with some embodiments of the present disclosure, the sidewall portion of the protective liner has a height greater than a height of the lower metal contact so as to laterally cover the upper metal contact.

In accordance with some embodiments of the present disclosure, the sidewall portion of the protective liner has a height less than a height of the lower metal contact so as to permit a lower portion of the upper metal contact to laterally cover an upper portion of the lower metal contact.

In accordance with some embodiments of the present disclosure, the protective liner is configured as a flat layer.

In accordance with some embodiments of the present disclosure, a semiconductor device includes a first dielectric structure, a hybrid metal contact structure disposed in the first dielectric structure, a second dielectric structure disposed on the first dielectric structure, and a via contact. The hybrid metal contact structure includes a lower metal contact and an upper metal contact. The lower metal contact has a height less than a height of the first dielectric structure, and is formed of a first metal material. The upper metal contact is disposed on and in contact with the lower metal contact. The upper metal contact is formed of a second metal material different from the first metal material, and has a bottom surface with a dimension which is the same as a dimension of a top surface of the lower metal contact. The via contact penetrates through the second dielectric structure to be electrically connected to the upper metal contact. The via contact is formed of a metal material which is the same as the second metal material, and has a horizontal cross-section area that is less than a contact area between the upper metal contact and the lower metal contact.

In accordance with some embodiments of the present disclosure, the semiconductor device further includes a substrate including an active region, a conductive contact disposed on the active region, and a protective liner disposed on the conductive contact to separate the conductive contact from the hybrid metal contact structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a lower metal contact in a trench of a first dielectric structure disposed on a substrate, the lower metal contact having a height less than a depth of the trench and being made of a first metal material;
    forming an upper metal contact to fill the trench and to be in contact with the lower metal contact, the upper metal contact being formed of a second metal material different from the first metal material and having a bottom surface with a dimension which is the same as or greater than a dimension of a top surface of the lower metal contact;
    forming a second dielectric structure on the first dielectric structure; and
    forming a via contact penetrating through the second dielectric structure to be electrically connected to the upper metal contact, the via contact being formed of a metal material which is the same as the second metal material,
    wherein the method further comprises, prior to forming the lower metal contact;

forming a conductive contact on an active region in the substrate; and forming a protective liner on the conductive contact to separate the conductive contact from the lower metal contact, and wherein forming the protective liner includes:

conformally depositing a protective layer on the first dielectric structure to cover the conductive contact;

depositing a photoresist layer on the protective layer;

etching back the photoresist layer to permit the photoresist layer to have a height less than the depth of the trench;

after etching back the photoresist layer, removing a portion of the protective layer above the photoresist layer; and removing the photoresist layer.

2. The method according to claim 1, wherein formation of the lower metal contact is performed after forming the protective liner and includes:

selectively depositing the first metal material on the protective liner to fill the trench; and removing a top portion of the first metal material to permit the height of the lower metal contact to be less than the depth of the trench.

3. The method according to claim 1, wherein formation of the lower metal contact is performed after forming the protective liner, and includes selectively depositing the first metal material on the protective liner to directly form the lower metal contact having a height less than the depth of the trench.

4. The method according to claim 1, wherein forming the upper metal contact includes:

depositing the second metal material on the lower metal contact to fill the trench and to cover the first dielectric structure; and removing a portion of the second metal material above the first dielectric structure.

5. The method according to claim 2, wherein formation of the lower metal contact further includes:

forming an adhesion layer to cover the first metal material;

removing the adhesion layer and excess of the first metal layer above the first dielectric structure; and etching back the first metal material remaining in the trench.

6. The method according to claim 1, wherein the protective liner is formed to include a bottom portion disposed below the lower metal contact and a sidewall portion extending upwardly from a periphery of the bottom portion to laterally cover the lower metal contact, the sidewall portion of the protective liner having a height less than a height of the lower metal contact.

7. The method according to claim 1, wherein formation of the lower metal contact is performed by:

filling the first metal material in the trench by a super conformal atomic layer deposition process or a super conformal chemical vapor deposition process; and removing a top portion of the first metal material to form the lower metal contact which is free of seam.

8. The method according to claim 3, wherein formation of the lower metal contact is performed by selective chemical vapor deposition or selective atomic layer deposition, so that a seam is formed in the lower metal contact.

9. The method according to claim 1, wherein the dimension of the bottom surface of the upper metal contact is the same as the dimension of the top surface of the lower metal contact.

10. The method according to claim 1, wherein the upper metal contact is formed to be separated from the protective liner by the lower metal contact.

11. The method according to claim 1, wherein the protective liner is formed to include a bottom portion disposed between the lower metal contact and the conductive contact, and a sidewall portion extending upwardly from a periphery of the bottom portion, the sidewall portion of the protective liner having a height less than a height of the lower metal contact.

12. A method for manufacturing a semiconductor device, comprising:

forming a lower metal contact in a trench of a first dielectric structure disposed on a substrate, the lower metal contact having a height less than a depth of the trench and being made of a first metal material;

forming an upper metal contact to fill the trench and to be in contact with the lower metal contact, the upper metal contact being formed of a second metal material different from the first metal material and having a bottom surface with a dimension which is the same as or greater than a dimension of a top surface of the lower metal contact;

forming a second dielectric structure on the first dielectric structure; and forming a via contact penetrating through the second dielectric structure to be electrically connected to the upper metal contact, the via contact being formed of a metal material which is the same as the second metal material and having a bottom surface with a dimension which is smaller than the dimension of the top surface of the lower metal contact, wherein the method further comprises, prior to forming the lower metal contact;

forming a conductive contact in the trench and on an active region in the substrate; and forming a protective liner on the conductive contact to separate the conductive contact from the lower metal contact, the protective liner including a bottom portion below the lower metal contact and a sidewall portion extending upwardly from a periphery of the bottom portion to laterally cover the lower metal contact, and wherein formation of the lower metal contact and formation of the protective liner are performed simultaneously and include:

conformally depositing a protective layer on the first dielectric structure to cover the conductive contact;

depositing the first metal material to fill the trench and to cover the protective layer;

removing a portion of the first metal material and a portion of the protective layer above the first dielectric structure; and after removing the portion of the protective layer and the portion of the first metal material, simultaneously etching back the first metal material and the protective layer in the trench.

13. The method according to claim 12, wherein the sidewall portion of the protective liner has a height which is the same as a height of the lower metal contact.

14. The method according to claim 12, wherein the first metal material is deposited by chemical vapor deposition, plasma-enhanced chemical vapor deposition, atomic layer deposition, or plasma-enhanced atomic layer deposition, so that a seam is formed in the lower metal contact.

15. The method according to claim 12, wherein the upper metal contact is formed to be in contact with the lower metal contact and the protective liner.

16. A method for manufacturing a semiconductor device, comprising:

forming a lower metal contact in a trench of a first dielectric structure disposed on a substrate, the lower metal contact having a height less than a depth of the trench and being made of a first metal material;

forming an upper metal contact to fill the trench and to be in contact with the lower metal contact, the upper metal contact being formed of a second metal material different from the first metal material and having a bottom surface with a dimension which is the same as or greater than a dimension of a top surface of the lower metal contact;

forming a second dielectric structure on the first dielectric structure; and forming a via contact penetrating through the second dielectric structure to be electrically connected to the upper metal contact, the via contact being formed of a metal material which is the same as the second metal material and having a bottom surface with a dimension which is smaller than the dimension of the top surface of the lower metal contact, wherein the method further comprises, prior to forming the lower metal contact;

forming a conductive contact in the trench and on an active region in the substrate; and forming a protective liner on the conductive contact to separate the conductive contact from the lower metal contact, the protective liner including a bottom portion below the lower metal contact and a sidewall portion extending upwardly from a periphery of the bottom portion to laterally cover the lower metal contact, and wherein formation of the lower metal contact and formation of the protective liner include:

conformally depositing a protective layer on the first dielectric structure to cover the conductive contact;

depositing the first metal material to fill the trench and to cover the protective layer;

removing a portion of the first metal material and a portion of the protective layer above the first dielectric structure; and after removing the portion of the protective layer and the portion of the first metal material, selectively etching back the protective layer in the trench using a first etchant and selectively etching back the first metal material in the trench using a second etchant different from the first etchant.

17. The method according to claim 16, wherein the sidewall portion of the protective liner has a height greater than a height of the lower metal contact so as to laterally cover a lower portion of the upper metal contact.

18. The method according to claim 16, wherein the sidewall portion of the protective liner has a height less than a height of the lower metal contact so as to permit a lower portion of the upper metal contact to laterally cover an upper portion of the lower metal contact.

19. The method according to claim 17, wherein the upper metal contact is formed to permit a lower portion of the upper metal contact to be laterally covered by the sidewall portion of the protective liner.

20. The method according to claim 18, wherein the lower portion of the upper metal contact is formed to be in contact with the side wall portion of the protective liner.

* * * * *